United States Patent [19]

Morita et al.

[11] Patent Number: 5,767,665
[45] Date of Patent: Jun. 16, 1998

[54] PHASE DIFFERENCE MEASURING APPARATUS AND MASS FLOWMETER THEREOF

[75] Inventors: Akira Morita, Tokyo; Hiroyuki Yoshimura, Kanagawa, both of Japan

[73] Assignee: Fuji Electric Co. Ltd., Kawasaki, Japan

[21] Appl. No.: 526,706

[22] Filed: Sep. 12, 1995

[30]  Foreign Application Priority Data

| Sep. 13, 1994 | [JP] | Japan | 6-217743 |
| Mar. 22, 1995 | [JP] | Japan | 7-062675 |
| Mar. 22, 1995 | [JP] | Japan | 7-062676 |

[51] Int. Cl.$^6$ ............... G01R 25/00; G01F 1/84
[52] U.S. Cl. ............... 324/76.52; 73/861.356
[58] Field of Search ............ 324/76.52, 76.53, 324/76.55, 76.68; 73/861.356, 861.355; 364/510, 484

[56]  References Cited

U.S. PATENT DOCUMENTS

| 3,513,385 | 5/1970 | Pascoe | 324/76.52 X |
| 3,895,294 | 7/1975 | Vinding | 324/76.52 X |
| 4,934,196 | 6/1990 | Romano . | |
| 5,050,439 | 9/1991 | Thompson | 73/861.356 |
| 5,052,231 | 10/1991 | Christ et al. . | |
| 5,069,074 | 12/1991 | Young et al. | 73/861.356 |
| 5,460,033 | 10/1995 | Lew et al. . | |
| 5,469,758 | 11/1995 | Kalotay | 73/861.356 |

FOREIGN PATENT DOCUMENTS

| 4205300 | 7/1993 | Germany . |
| 4319344 | 1/1995 | Germany . |
| 8802105 | 3/1988 | WIPO . |

Primary Examiner—Michael Brock
Attorney, Agent, or Firm—Greer, Burns & Crain, Ltd.

[57]  ABSTRACT

A phase difference measuring apparatus for accurately measuring the phase difference (fine time difference) of two signals with the same frequency with a reduced number of bits for A/D conversion is disclosed. In addition to output signals of an upstream side pickup and a downstream side pickup of a mass flowmeter, an output signal of the upstream side pickup or the downstream side pickup is supplied to a comparator, a PLL circuit, an antialiase filter, a sample and hold circuit, and an A/D converter. These circuits quantize these signals and send the quantized signals to a band pass filter. The band pass filter extracts a predetermined signal component and outputs it to a DFT. The DFT performs complex Fourier transformation on the input signal. Thus, the phase difference between two signals with the same frequency (such as an upstream side pickup signal and a downstream side pickup signal) can be accurately detected with a reduced number of bits for each of the A/D converters.

11 Claims, 22 Drawing Sheets

1

PHASE DIFFERENCE MEASURING APPARATUS AND MASS FLOWMETER THEREOF

BACKGROUND OF THE INVENTION

1. Field of the Invention

The present invention relates to a phase difference measuring apparatus for measuring the phase difference between two signals with the same frequency.

In addition, the present invention relates to a phase difference measuring apparatus for measuring the phase difference between two signals at a predetermined frequency, in particular, to a modification of an error compensating method in the measurement of the phase difference.

2. Description of the Related Art

Such a phase difference measuring apparatus can be used in various fields. An example of the apparatus is an industrial instrument such as a Coriolis type mass flowmeter that detects the phase difference (time difference) of vibrations due to Coriolis force caused by the mass and speed of a fluid that flows in an upstream side pipe and a downstream side pipe, so as to obtain a flow rate thereof.

FIG. 1 is a schematic diagram showing a primal construction of a Coriolis type mass flowmeter.

In FIG. 1, reference numeral 101 is a U shaped pipe in which a fluid flows. At a center portion of the U shaped pipe 101, a permanent magnet 102 is securely disposed. Both edges of the U shaped pipe 101 are secured to a base 103. Reference numeral 104 is a solenoid coil that surrounds the U shaped pipe 101. Reference numeral 105 is a support frame that supports the solenoid coil 104. The frame 105 is securely disposed on the base 103. A base side portion of the U shaped pipe 101 functions as a nodal point of vibration such as a turning fork, thereby preventing vibration energy from being easily lost. Reference numerals 1A and 1B are solenoid pickups that detect velocity of both legs of the U shaped pipe 101. When the U shaped pipe 101 is vibrated at its natural frequency (sin ωt) by the electromagnetic force that works between the solenoid coil 104 and the permanent magnet 102 secured to the U shaped pipe 101, Coriolis force works on the fluid that flows in the U pipe 101.

FIG. 2 is a isometric view showing a vibration of the U shaped pipe.

The magnitude of the Coriolis force is proportional to the mass and speed of the fluid that flows in the U shaped pipe. The direction of the Coriolis force accords with the product of the vectors of the moving direction of the fluid and the angular velocity of the U shaped pipe 101. In addition, since the flow direction of the fluid on the input side of the U shaped pipe 101 is the reverse of that on the output side, Coriolis force that works at both legs of the U shaped pipe 101 produces a twisting torque. This torque varies with the excitation frequency. The amplitude of the torque is proportional to the mass and flow rate of the fluid that flows in the U shaped pipe 101. FIG. 3 is an isometric view showing a vibration mode caused by the twisting torque.

When the amplitude of the twisting torque is detected by the pickups 1A and 1B, the mass and flow rate of the fluid can be obtained. However, the real vibration of the U shaped pipe is the sum of the vibration caused by the solenoid coil 104 and the vibration caused by the twisting torque due to the Coriolis force. The vibration on the upstream side of the U shaped pipe 101 is expressed by $\sin(\omega t - \alpha)$, whereas the vibration on the downstream side thereof is expressed by

2

$\sin(\omega t + \alpha)$. Thus, there is a phase difference ($2\alpha$), or time difference ($\Delta t$) between signals e1 and e2 detected by the pickups 1A and 1B, as shown in FIG. 4. The phase difference varies depending on the type of the pipe and the excitation frequency. In the case of the U shaped pipe 101, when the resonance frequency thereof is 80 Hz, there is a time difference of approximately 120 µs at the maximum flow rate. A resolution of 0.01% of the maximum phase difference should be compensated. Thus, a time measuring resolution of 12 ns is required.

The time difference can be measured by various methods. One of the simplest methods is a method for counting time difference gate pulses using a reference clock. An example of this method is shown in FIG. 5. In FIG. 5, an upstream side pickup signal Pu and a downstream side pickup signal Pd are amplified by respective amplifiers 111 (with an amplification factor of B). The amplified signals are supplied to respective comparators 112. The comparators 112 digitize respective input signals and output digitized signals to an exclusive-OR circuit 113. The exclusive-OR circuit 113 performs an exclusive-OR operation for the digitized signal and outputs a gate pulse Pg with a pulse width that is equivalent to the time difference between the upstream side pickup signal Pu and the downstream side pickup signal Pd. The gate pulse Pg is supplied to a counter 114. The counter 114 measures gate pulse time by counting a reference clock 115 within gate pulse. The frequency of the reference clock should be 85 MHZ or higher.

When this U shaped pipe is used in a real plant, since it is bent, it has problems of pressure loss and difficulty of cleaning. To solve such problems, a straight-pipe type Coriolis flowmeter has been proposed. FIG. 6 shows an example of the straight-pipe type Coriolis flowmeter.

In FIG. 6, reference numeral 121 is a straight pipe in which a fluid to be measured flows. At a center portion of the straight pipe 121, a permanent magnet 123 is securely disposed. Both edges of the straight pipe 121 are secured to a base 120. Reference numeral 122 is a solenoid coil that surrounds the straight pipe 121. Reference numeral 124 is a support frame that supports the solenoid coil 122. The frame 124 is secured to the base 120. Since the straight pipe has a higher rigidity and a higher twisting resistance than the U shaped pipe, the time difference between the upstream side pickup signal and the downstream side pickup signal becomes smaller.

For example, the resonance frequency of the straight pipe is approximately 1 kHz and the time difference at the maximum flow rate is approximately 2 µs. The measurement should be performed with a resolution of 0.01% of the maximum time difference. Thus, a time measuring resolution of 0.2 ns is required. To count pulses, a reference clock with a frequency of 5 GHz is required. It is impossible to produce such a clock oscillator. Even if such a clock oscillator can be produced, when comparators that obtain time difference signals from pickup signals are used, and since jitter due to intermediate zone of input signals takes place (the intermediate zone is an instable level between "1" and "0"), it is doubtful of being able to obtain an accuracy of 0.2 ns.

Thus, the measurement is performed as shown in FIG. 7. The following subtraction between the upstream side pickup signal Pu and the downstream side pickup signal Pd is performed by a differential device (subtracting device) 131.

$$\sin(\omega t + \alpha) - \sin(\omega t - \alpha) = 2 \cos \Omega t \times \sin \alpha$$

Thus, a weak phase signal with an amplitude of sin α (where α is 0.1 ns against a period of 1 ms) is obtained. The phase signal is supplied to an amplifier 132 (with an amplification factor of B). The amplified signal is supplied to a narrow band filter 133. The narrow band filter 133 extracts only a predetermined frequency component. The resultant signal is supplied to a full-wave rectifying and detecting device 134. The full-wave rectifying and detecting device 134 outputs a DC level of B sin α. The resultant signal is supplied to an A/D converter 135. The A/D converter 135 outputs a digital value of sin α. Thus, the phase difference α is obtained. Due to the offset current of the amplifier and voltage drift caused temperature, if the temperature environment of the plant is not stable, the measurement error becomes large. Consequently, in practice, the accuracy of 0.01% of the maximum flow rate cannot be obtained.

To prevent the influence of voltage drift in the amplifier, a method for obtaining the phase difference by Fourier transformation of digital signals has been proposed. FIG. 8 is a block diagram showing the construction of an apparatus corresponding to such a method.

Referring to FIG. 8, an upstream side pickup signal Pu and a downstream side pickup signal Pd are obtained by an upstream side pickup 1A and a downstream side pickup 1B, respectively. The upstream side pickup signal Pu and the downstream side pickup signal Pd are supplied to respective amplifiers 141. The amplifiers 141 amplify the upstream side pickup signal Pu and the downstream side pickup signal Pd. The amplified signals are supplied to respective sample and hold circuits 142. The sample and hold circuits 142 sample and hold the amplified signals. The sampled levels are supplied to respective A/D converters 143. The A/D converter 143 digitizes the sampled levels. The resultant digital signals are stored in a data memory 144. The data memory 144 stores the digital signal as a discrete data sequence. A digital signal processor (DSP) 145 performs a digital filtering operation on the discrete data sequence so as to remove a noise component. In addition, the DSP 145 analyzes frequencies of the input signal, and performs a complex Fourier transformation for obtaining a real part and an imaginary part of the signal at exiting frequency, so as to obtain the phases of the real part and imaginary part of the excitation frequency of the solenoid coil.

Next, the theory of phase measurement corresponding to the complex Fourier transformation will be described.

Assuming that the Fourier transformation of a time function f(t) is denoted by F(U), F(U) can be expressed by the following equation (1).

$$F(U) = \int_{-\infty}^{+\infty} f(t) e^{-jut} dt \quad (1)$$

Next, assuming that the Fourier transformation of a time function f(t+a) is F(U'), F(U') can be expressed by the following equation (2).

$$F(U') = \int_{-\infty}^{+\infty} f(t+a) e^{-jut} dt$$

when t+a=T $$= \int_{-\infty}^{+\infty} f(T) e^{-juT} e^{jua} dT = e^{jua} \underbrace{\int_{-\infty}^{+\infty} f(T) e^{-juT} dT}_{F(U)} \quad (2)$$

$$= F(U) e^{jua}$$

FIGS. 9A and 9B are schematic diagrams showing the relationship between F(U) and F(U'). Thus, it is clear that the advance of a phase on the time axis is the advance of a phase in the frequency range. Consequently, assuming $$F(U)=A+jB,$$

thus, $$F(U')=F(U) \, e^{jUa}=(A+jB) \, (\cos Ua+j \sin Ua)$$

From these vector components, the phase can be obtained.

In the above-described phase calculation, since the resolution of the vector components affects the resolution of the phase, each of the A/D converters for the pickup signals requires a large number of bits. In addition, the phase detection sensitivity depends on the number of bits of the A/D converters. For example, assuming that the excitation frequency of a straight pipe is 1 kHz and the minimum detectable time is 0.1 ns, the number of bits required for both A/D converters is 24.

Although 24-bit type A/D converters are available, the conversion speed is 16 ms, which is too slow to sample a pickup signal with a frequency of 1 kHz. Moreover, in the case that the full scale of the A/D converter is 10 V, LSB (Least significant bit) is 0.6 μV. In a plant with a bad noise environment since the error indication becomes large, such the conversion level cannot be smaller. Actually, in practice, the time difference cannot be measured with a resolution of 0.1 ns.

In the case of the straight-pipe type Coriolis flowmeter that has a low pressure loss and easy-cleaning construction, when the method for obtaining the time difference corresponding to the complex Fourier transformation of the digital signal process is used, since the practical detecting resolution is low (approximately, 5 ns), an accuracy of 1% cannot be accomplished.

As a method for compensating an error in measuring a time difference, one of two signals to be measured is manually input to two input terminals of a phase difference measuring portion so as to be used as a compensation signal. The measurement value of the phase difference measuring portion is used as an offset value. During the measurement, the offset value is subtracted from the measurement value so as to compensate the measurement value.

However, when measuring a phase difference with high accuracy, variations of the frequency, amplitude, and DC level of a measured signal make errors. Thus, the reference phase difference used for the compensation should be measured with the frequency, amplitude, and DC level that do not vary. Conventionally, a reference phase difference (compensation signal) with no phase difference is generated with one signal. Thus, when the phase difference of signals whose frequencies and amplitudes vary from time to time is measured, the reference phase difference should be manually designated to 0. Since the reference phase difference is generated with the same signal, the same amplitude and the same DC level cannot be used for the two measurement signals, resulting in an error. In addition, when the phase difference deviates significantly from 0°, a satisfactory accuracy cannot be accomplished with the reference of phase difference=0.

SUMMARY OF THE INVENTION

An object of the present invention is to provide a phase difference measuring apparatus with a high detecting resolution so as to obtain a phase difference with high accuracy.

Another object of the present invention is to provide a phase difference measuring apparatus for compensating a phase difference measurement error so as to obtain a high measurement accuracy regardless of variations in frequency, amplitude, and DC level of a measurement signal.

A further object of the present invention is to provide a mass flowmeter with high detecting resolution so as to obtain a phase difference with high accuracy and also to accurately measure a flow rate.

A first aspect of the present invention is a phase difference measuring apparatus for measuring the phase difference of two signals with the same frequency, comprising a calculating means for calculating the sum or the difference of the two signals, a quantizing means for quantizing the output signal of the calculating means and the two signals, a band pass filter means for extracting only a predetermined frequency component from the quantized signals, and a phase difference calculating means for performing a Fourier transformation and a predetermined operation for the output signal of the band pass filter means so as to calculate the phase difference of the signals at a measuring frequency.

As a second aspect of the present invention, the quantizing means of the first aspect includes a comparator for digitizing the amplitude of one of the two signals, a PLL circuit for generating a signal with a frequency n times ($n \geq 2$) higher than the frequency of the output signal of the comparator, and an A/D converting means for quantizing the output signal of the calculating means and the two signals at a timing of the output signal of the PLL circuit.

As a third aspect of the present invention, the calculating means of the first aspect has a gain selecting function for selecting a detection range and a resolution at a timing of the phase difference to be detected.

As a fourth aspect of the present invention, the quantizing means of the first or second aspect includes a sample and hold means for sampling and holding the two signals and the output signal of the calculating means.

A fifth aspect of the present invention is the phase difference measuring apparatus of the first or second aspect, further comprising an amplitude varying means for varying the amplitude of at least one of the two signals, and a compensating means for obtaining compensation data corresponding to the variation of the amplitudes of the two signals and for compensating the phase difference corresponding to the compensation data.

A sixth aspect of the present invention is the phase difference measuring apparatus of the first or second aspect further comprising a signal amplitude difference detecting means for detecting the amplitude difference of the two signals, and a gain control amplifier for matching the amplitude of one of the two signals with the amplitude of the other signal corresponding to the amplitude difference.

According to the present invention, in addition to two signals with the same frequency, a third signal that is generated by adding the former two signals or by subtracting one of the two signals from the other signal is used. The amplitudes and phases of the three signals are used. Thus, the number of bits required for each A/D converter can be smaller than for the conventional method that uses the two signals. In addition, the phase difference of the two signals can be accurately detected. Consequently, to obtain an accuracy of 0.01%, the number of bits required for each of the A/D converters is as small as 14 to 16 bits.

In addition, since the comparator that digitizes the amplitudes of one of the two signals with the same frequency and the PLL circuit that generates a signal with a frequency that is n times higher than the frequency of the output signal of the comparator ($n \geq 2$), the cut-off frequency of each digital filter can be varied corresponding to the variation of the signal frequencies without need to change constants of the program used for the digital filter calculations.

When the calculating means that obtains the sum or the difference of the two signals has the gain selecting function, the detecting range and resolution of the phase difference to be detected can be varied. When the quantizing means has the sample hold means that samples and holds the two signals and the output signal of the calculating means, these signals can be accurately measured.

When the amplitude varying means that varies the amplitudes of the two signals and the compensating means that compensates the phase difference thereof are additionally used, the phase difference can be accurately obtained regardless of the difference in the amplitudes of the two signals. Alternatively, when the signal amplitude difference detecting means that detects the difference in the amplitudes of the two signals and the gain control amplifier that matches the amplitudes of the two signals corresponding to the detected amplitude difference are used, the same effect can be obtained.

A seventh aspect of the present invention is a phase difference measuring apparatus for measuring the phase difference of two signals at a predetermined frequency, comprising a compensation signal generating means for generating a compensation signal for designating at least one kind of a phase difference with the same frequency as the frequency of one of two measurement signals, a selecting means for selecting the measurement signals and the compensation signal, a phase difference measuring means for measuring the phase difference of each of the measurement signals and the compensation signal, and a compensation control means for controlling the selecting means so as to compensate the measurement value supplied from the phase difference measuring means.

As an eighth aspect of the present invention, the compensation signal generating means of the seventh aspect includes a digitizing means for digitizing one of the two measurement signals, a frequency multiplying means for multiplying the frequency of the digitized signal by a predetermined value, an address generating means for generating addresses which cycle is accord with one cycle of the measurement signal corresponding to the output signal of the frequency multiplying means, at least one storage means for prestoring data that represents one cycle of a sine wave with the addresses that are output from the address generating means, and two D/A converters for converting the sine wave data that is output from the storage means into an analog signal.

A ninth aspect of the present invention is the phase difference measuring apparatus of the seventh or eighth aspect, further comprising first and second amplitude detecting means for detecting the amplitudes of the two measurement signals, third and fourth amplitude detecting means for detecting the amplitudes of the two compensation signals, a first comparing means for comparing the output signal of the first amplitude detecting means with the output signal of the third amplitude detecting means, a second comparing means for comparing the output signal of the second amplitude detecting means with the output signal of the fourth amplitude detecting means, and a pair of amplitude control means for matching the amplitude of each of the measurement signals with the amplitude of each of the compensation signals corresponding to the compared results.

A tenth aspect of the present invention is the phase difference measuring apparatus of the seventh or eighth aspect, further comprising first and second DC level detecting means for detecting the DC levels of the two measurement signals, third and fourth DC level detecting means for detecting the DC levels of the two compensation signals, a first comparing means for comparing the output signal of the first DC level detecting means with the output signal of the third DC level detecting means, a second comparing means for comparing the output signal of the second DC level detecting means with the output signal of the fourth DC level detecting means, and a pair of DC level control means for matching the DC level of each of the measurement signals with the DC level of each of the compensation signals.

An eleventh aspect of the present invention is the phase difference measuring apparatus of the eighth aspect, further comprising a shifting means for shifting the addresses generated by the address generating means, and a designating means for controlling a shift amount and generating at least one type of a phase difference signal.

A twelfth aspect of the present invention is the phase difference measuring apparatus of the seventh, further comprising a notifying means for notifying the compensation control means of the input of a reference signal to the phase difference measuring means, a storage means for storing the measurement value of the phase difference measuring means corresponding to the input from the notifying means, and an adjusting means for obtaining the difference between the stored value and the measurement value of the phase difference measuring means and for canceling the phase difference of the reference signal corresponding to the difference.

A thirteenth aspect of the present invention is a phase difference measuring apparatus for measuring the phase difference of two signals at a predetermined frequency, comprising a clock generating means for generating a digital clock with a predetermined frequency, an address generating means for generating cyclic addresses corresponding to the clock, a shifting means for shifting the addresses generated by the address generating means, at least one pair of storage means for prestoring data that represents one cycle of a sine wave with the cyclic addresses generated by the address generating means and the shift means, two D/A converters for converting sine wave data that is output from the storage means into analog signals, a selecting means for selecting the measurement signals and the output signals of the D/A converters, a frequency detecting means for detecting the frequency of one of the two measurement signals, two amplitude detecting means for detecting the amplitudes of the two measurement signals, two DC level detecting means for detecting the DC levels of the two measurement signals, and a compensation control means for premeasuring the relationship of frequencies, amplitudes, DC levels, and a phase difference of output signals of the D/A converters, obtaining compensation data therefrom, storing the compensation data, and search (look up) or interpolating the compensation data from conditions of frequencies, amplitudes, DC levels, and phase differences that are adjacent to the conditions of the measurement signals.

According to the present invention, the compensation signal source with the same frequency, the same amplitude, and the same DC level as those of two measurement signals is disposed in the compensation unit of the phase difference measuring unit. Alternatively, the compensation signal source has the same frequency, the same amplitude, or the same DC level as those of the two measurement signals and the phase difference is known. As the seventh aspect of the present invention, the compensation signal and the measurement signal are measured on a time-sharing basis. Alternatively, as the thirteenth aspect of the present invention, the measurement signal is compensated corresponding to the compensation data that is stored as the compensation signal. Thus, an error due to the variation of at least one of the frequency, amplitude, and DC level can be compensated for.

In addition, according to the eighth aspect or eleventh aspect of the present invention, the phase difference of the compensation signals can be freely designated. Moreover, according to the ninth aspect of the present invention, the amplitude (AC level) of the measurement signal can be matched with that of the compensation signal. Alternatively, according to the tenth aspect of the present invention, the DC level of the measurement signal can be matched with that of the compensation signal. In addition, according to the twelfth aspect of the present invention, the offset adjustment can be performed.

A fourteenth aspect of the present invention is a mass flowmeter for causing a fluid to flow in a vibrating pipe, and for Coriolis force of the flow and angular vibration of the pipe, to twist-vibrate the pipe, and for obtaining the mass and flow rate of the fluid corresponding to the time difference of the twisted asymmetrical vibrations of the pipe, comprising a pair of detectors for detecting the asynchronous twisting vibrations of the pipe, a calculating means for calculating the sum or the difference of the output signals of the detectors, a quantizing means for quantizing the output signals of the calculating means and the detectors, a band pass filter means for extracting only a predetermined frequency component from the quantized signals, and a phase difference calculating means for performing a Fourier transformation and a predetermined operation on the output signal of the band pass filter means so as to calculate the phase difference of the signals at a measuring frequency.

As a fifteenth aspect of the present invention, the quantizing means of the fourteenth aspect includes a comparator for digitizing the amplitudes of the output signals of the detectors, a PLL circuit for generating a signal with a frequency n times (where $n \geq 2$) higher than the frequency of the output signal of the comparator, a sample and hold means for sampling and holding the output signals of the calculating means and the detectors at a timing of the output signal of the PLL circuit, and an A/D converting means for quantizing the output signal of the sample and hold means.

A sixteenth aspect of the present invention is the mass flowmeter of the fourteenth or fifteenth aspect, further comprising an amplitude varying means for varying the amplitude of at least one of the output signals of the detectors, and a compensating means for obtaining compensation data corresponding to the variation of the amplitudes of the output signals of the detectors and for compensating the phase difference corresponding to the compensation data.

A seventeenth aspect of the present invention is the mass flowmeter of the fourteenth or fifteenth aspect, further comprising a signal amplitude difference detecting means for detecting the amplitude difference in the output signals of the detectors, and a gain control amplifier for matching the amplitude of one of the output signals of the detectors with the amplitude of the other signal corresponding to the amplitude difference.

According to the present invention, along with the upstream side pickup signal and the downstream side pickup signal, a third signal that is obtained by adding the former two signals or subtracting one of these signals from the other signal is used. Since the amplitudes and phases of these three signals are used, the number of bits required for each A/D converter is smaller than that of the conventional method that uses only the upstream side pickup signal and the downstream side pickup signal. In addition, the phase difference between the upstream side pickup signal and the downstream side pickup signal can be accurately detected. Thus, to obtain an accuracy of 0.01% (a resolution of 0.2 ns) at the maximum flow rate, the number of bits required for each A/D converter is as small as 14 to 16 bits.

In addition, since the comparator that digitizes the signal amplitudes of the two signals with the same frequency and the PLL circuit that generates a signal with a frequency that is n times higher than the frequency of the output signal of the comparator (where $n \geq 2$), the cut-off frequency of each digital filter can be varied corresponding to the variation of the signal frequencies without the need to change constants of the program used for the digital filter calculations. When the amplitude varying means that varies the amplitudes of the upstream side pickup signal and the downstream pickup signal and the compensating means that compensates the phase difference thereof are additionally used, the phase difference can be accurately obtained regardless of the difference in the amplitudes of the upstream side pickup signal and the downstream side pickup signals. Alternatively, when the signal amplitude difference detecting means that detects the difference in the amplitudes of the upstream side pickup signal and the downstream side pickup signal and the gain control amplifier that matches the amplitudes of the two signals corresponding to the detected amplitude difference, the same effect can be obtained.

These and other objects, features and advantages of the present invention will become more apparent in light of the following detailed description of best mode embodiments thereof, as illustrated in the accompanying drawings.

DETAILED DESCRIPTION OF THE PREFERRED EMBODIMENT

Figure 1:
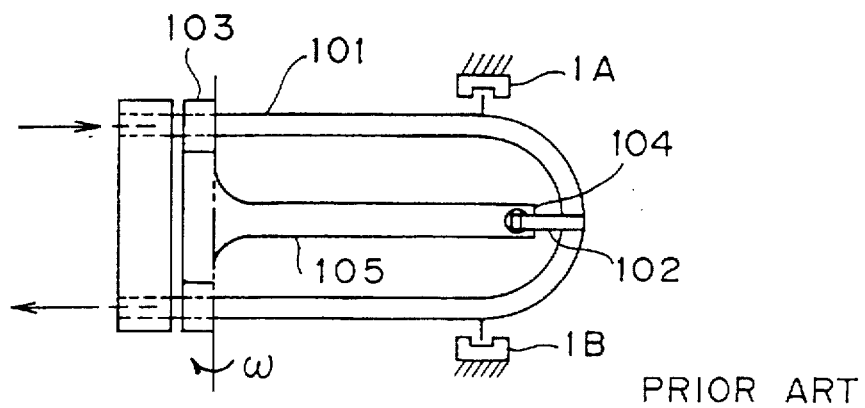
FIG. 1 is a schematic view showing a primal construction of a U shaped pipe type Coriolis mass flowmeter.
Figure 2:
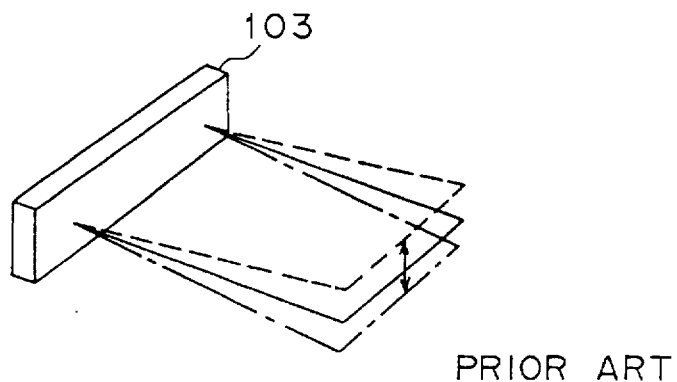
FIG. 2 is a isometric view for explaining a vibration of a U shaped pipe.
Figure 3:
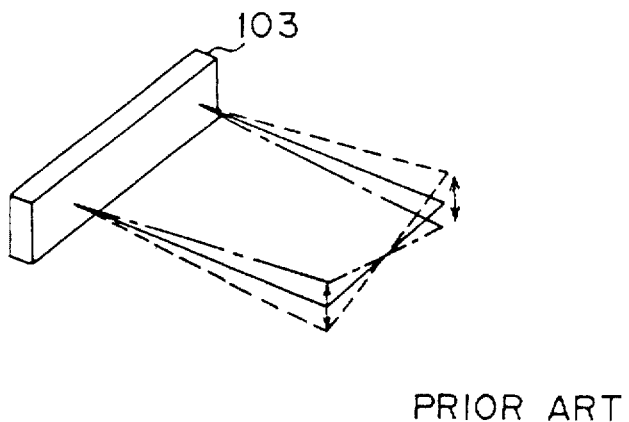
FIG. 3 is a isometric view for explaining a vibration mode caused by a twisting torque of a Coriolis force on the U shaped pipe.
Figure 4:
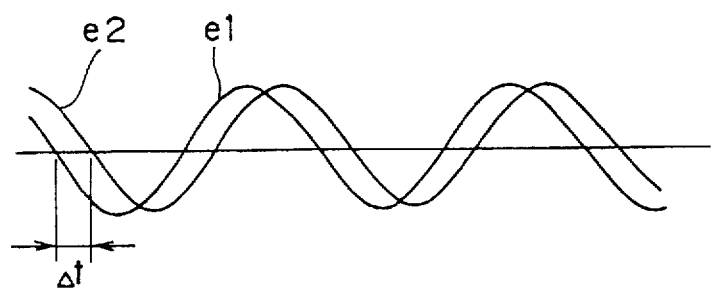
FIG. 4 is a schematic diagram showing an example of pickup signals in the case that a Coriolis force takes place in the U shaped pipe.
Figure 5:
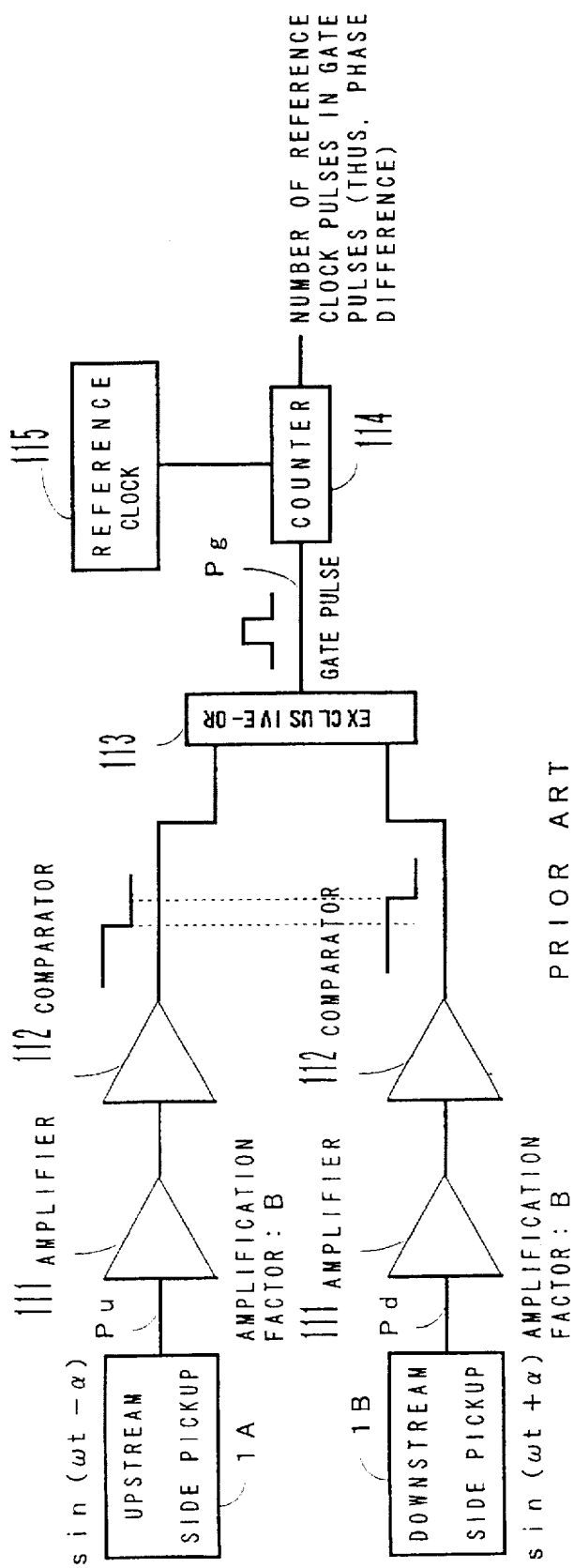
FIG. 5 is a block diagram showing a phase difference detecting circuit corresponding to a counter method.
Figure 6:
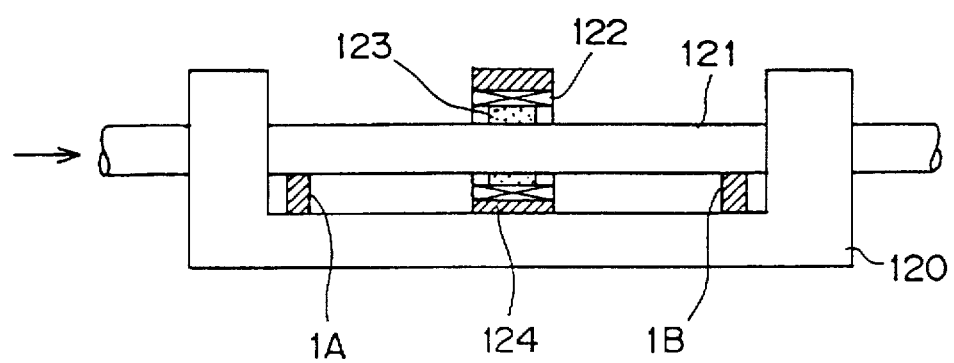
FIG. 6 is a schematic diagram showing a construction of an example of a straight-pipe type Coriolis mass flowmeter.
Figure 7:
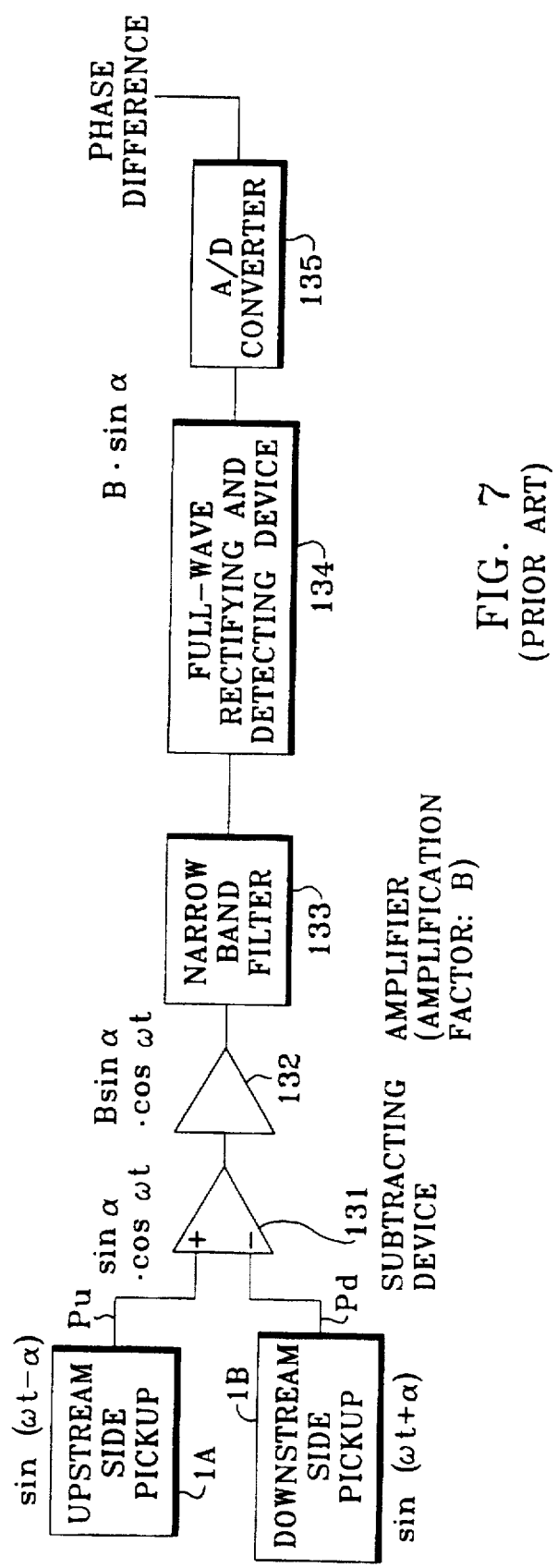
FIG. 7 is a block diagram showing a phase difference detecting circuit corresponding to a differential amplifying method.
Figure 8:
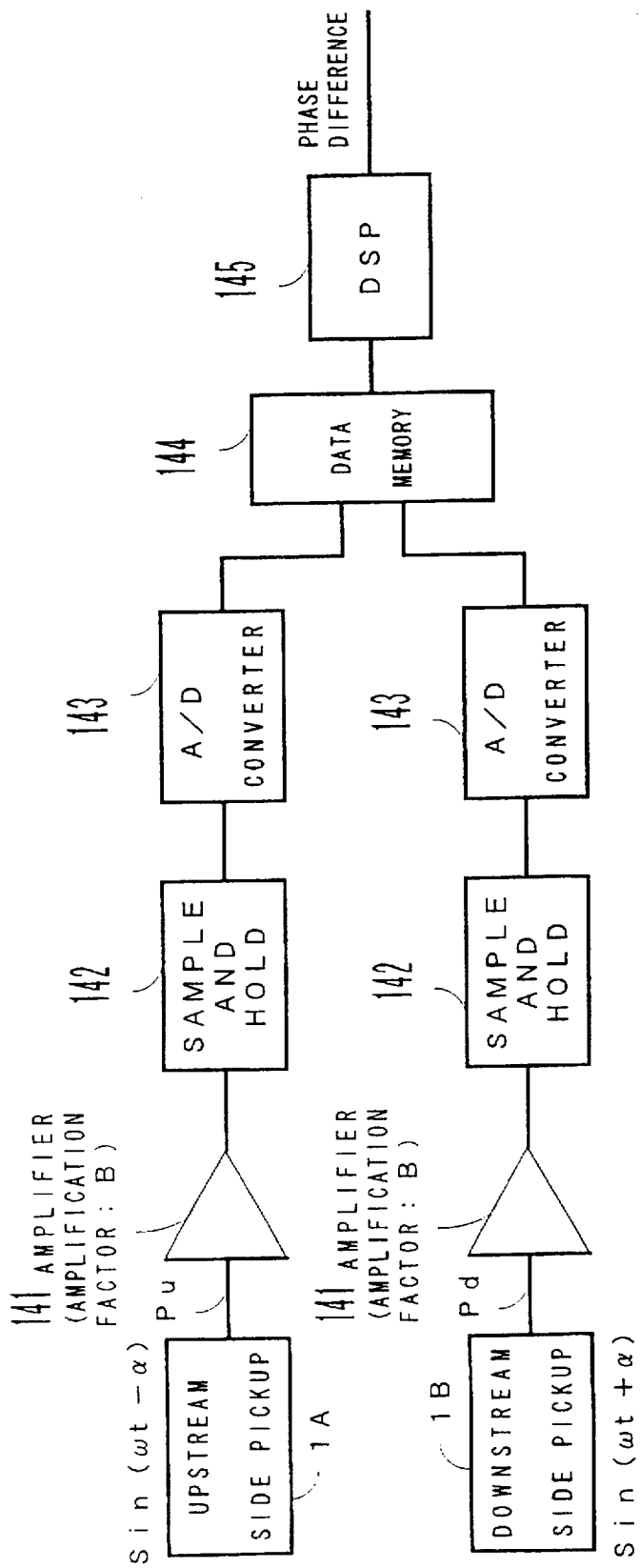
FIG. 8 is a block diagram showing a phase difference detecting circuit corresponding to a direct Fourier transformation method.
Figure 9A:
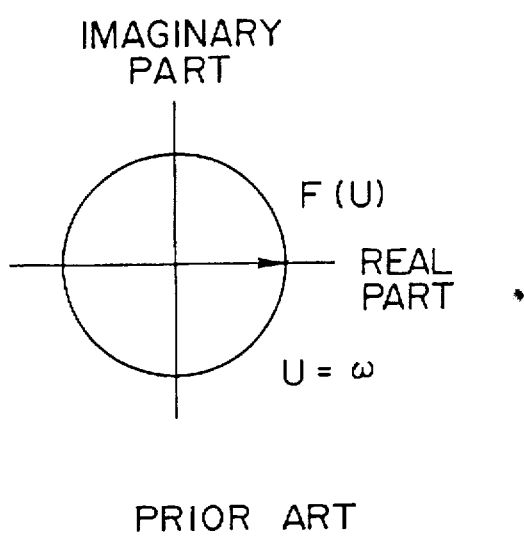
FIG. 9A is a schematic diagram for explaining the phase difference detecting theory of complex Fourier transformation, and shows a vector with a frequency of $\omega$ in FFT for a waveform with a phase difference of 0.
Figure 9B:
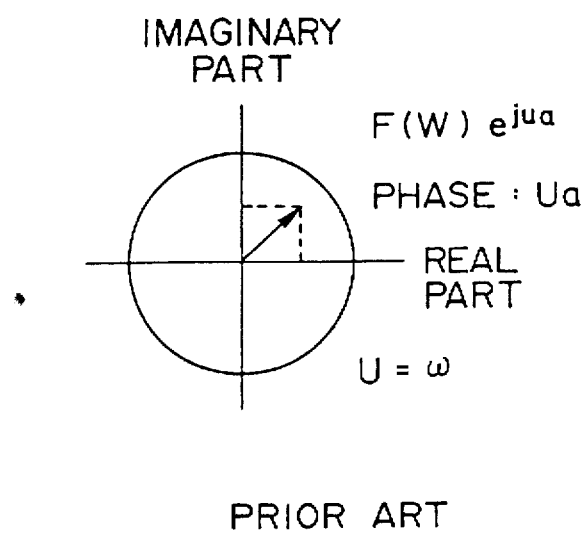
FIG. 9B is a schematic diagram for explaining the phase difference detecting theory of complex Fourier transformation, and shows a vector with a frequency of $\omega$ in FFT for a waveform with a phase difference of $\omega$.
Figure 10:
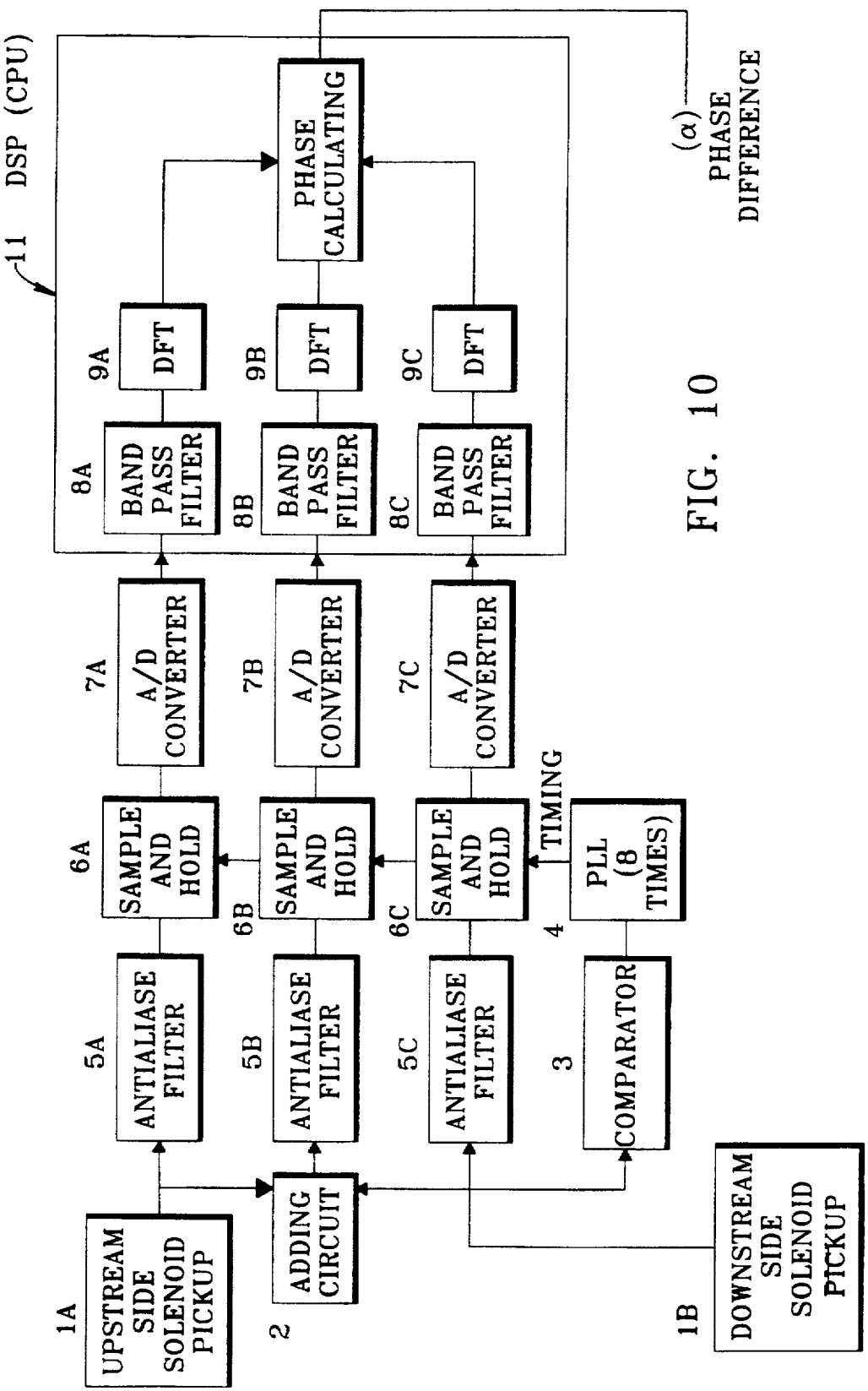
FIG. 10 is a block diagram showing a first embodiment of the present invention.

FIG. 10 is a block diagram showing an embodiment of the present invention. In FIG. 10, reference numerals 1A and 1B are an upstream side solenoid pickup and a downstream side solenoid pickup, respectively. Reference numeral 2 is an adding circuit. Reference numeral 3 is a comparator. Reference numeral 4 is a phase lock loop (PLL). Reference numerals 5A, 5B, and 5C are antialiase filters. Reference numerals 6A, 6B, and 6C are sample and hold circuits. Reference numerals 7A, 7B, and 7C are A/D converters. Reference numerals 8A, 8B, and 8C are band pass filters. Reference numerals 9A, 9B, and 9C are Discrete Fourier Transformers (DFTs). Reference numeral 10 is a phase calculating portion. The band pass filters 8A, 8B, and 8C, the DFTs 9A, 9B, and 9C, the phase calculating portion 10, and so forth are programmed in a digital signal processor (DSP) 11.

The upstream side pickup 1A outputs a signal A sin $(\omega t - \alpha)$. The downstream side pickup 1B outputs a signal $-B$ sin $(\omega t + \alpha)$. Thus, when the adding circuit 2 shown in FIG. 10 is used, the connection of the upstream side pickup 1A is the reverse of the connection of the downstream side pickup 1B, so that the phase difference between the upstream side pickup signal and the downstream side pickup signal becomes 180 deg at a flow rate of 0 ($\alpha=0$). When a subtracting circuit is used, it is not necessary to connect the upstream side solenoid pickup 1A and the downstream side solenoid pickup 1B in reverse.

The output signal of the adding circuit 2 can be expressed by the following equation (3).

$$A \sin(\omega t - \alpha) - B \sin(\omega t + \alpha) = -2A \sin \alpha \cos \omega t + (A-B)\sin(\omega t + \alpha) \quad (3)$$

At this point, the output signal of the adding circuit 2 that has a gain selecting function can be expressed by the following equation.

$$k\{-2A \sin \alpha \cos \omega t + (A-B)\sin(\omega t + \alpha)\}$$

When the constant k is variable, the resolution of the A/D converter 7B can be varied. In addition, the phase difference detecting resolution can be varied.

Figure 11:
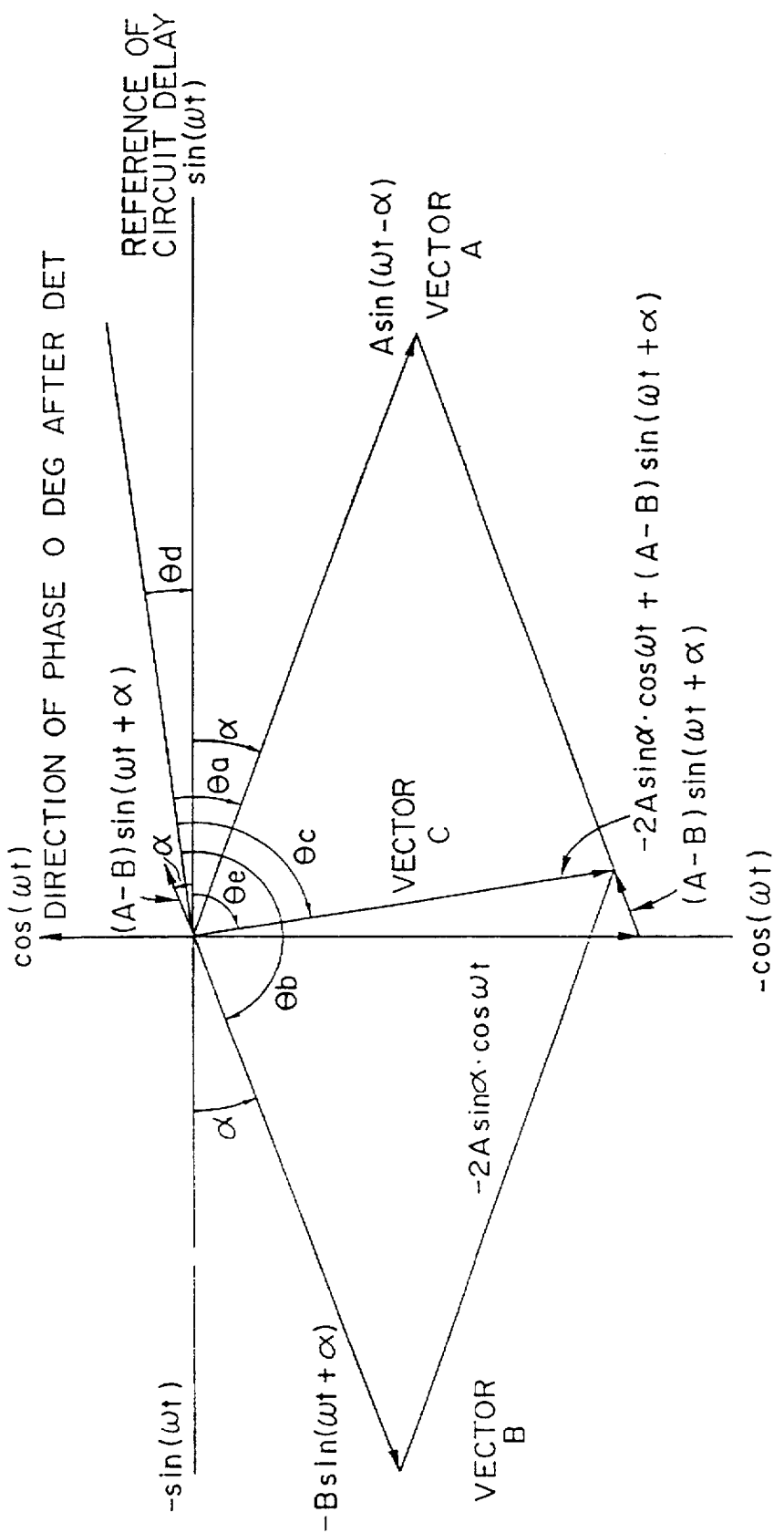
FIG. 11 is a vector diagram for explaining the operation of the first embodiment.

Assuming that the upstream side pickup signal is vector A, the downstream side pickup signal is vector B, and the output signal of the adding circuit is vector C these vectors can be represented as shown in FIG. 11. When the flow rate is 0 ($\alpha=0$), the direction of the vector A does not accord with the direction of the x-axis (sin $\omega t$) in FIG. 11 due to delays of the circuit system, the start position of a waveform used for discreate Fourier transformation, and so forth.

Assuming that the deviation angle is θd, the angle between the vector A and the delay axis of the circuit reference is θa, and the angle between the vector B and the delay axis of the circuit reference is θb, the angle θd can be expressed by the following equation (4).

$$(\theta a-\theta d)+(\theta b-\theta d)=\pi\theta d=(\theta a+\theta b-\pi)/2 \tag{4}$$

Thus, the angle θe of the vector C to the x-axis can be expressed by the following equation (5).

$$\theta e=\theta c-\theta d=\theta c-(\theta a+\theta b-\pi)/2 \tag{5}$$

On the other hand, the component of the y-axis of the vector C can be expressed by the following equation (6).

$$C \sin \theta e = 2A \sin \alpha - (A-B) \sin \alpha \tag{6}$$

Thus, assuming that the phase difference between the upstream side and the downstream side is α, the phase difference α can be expressed by the following equation (7).

$$\alpha=\sin^{-1}[C \sin \{\theta c-(\theta a+\theta b-\pi)/2\}/(A+B)] \tag{7}$$

The equation (7) represents that α, that is proportional to the mass and flow rate, can be obtained from the amplitudes and phases of the vectors A, B, and C. Since the sine function of the equation (7) is "1" in the normal state (A=B), α can be obtained from the magnitude (amplitude) of each vector. Consequently, according to this method, the number of bits required for each A/D converter can be reduced.

When the amplitudes and phases of the three signals are obtained, in this embodiment, these signals are supplied to low pass filters (LPF) 5A, 5B, and 5C in FIG. 10 (these filters are referred to as antialiasing filters) so as to remove noise components. The output signals of the LPFs 5A, 5B, and 5C are supplied to sample and hold circuits 6A, 6B, and 6C, respectively. The sample and hold circuits 6A, 6B, and 6C sample and hold respective input signals. The sampling timings of the sample and hold circuits 6A, 6B, and 6C are generated by the comparator 3 and the PLL 4. In this embodiment, the sampling frequency is eight times higher than the measuring frequency.

To reproduce the original signal, the input signal should be sampled with a frequency that is two or more times higher than the frequency of the original signal. Thus, in this case, the PLL 4 functions as a frequency multiplier. In addition, to improve the detecting accuracy of the phase difference, many A/D convertor bits (for example, 16 bits) are required. In this embodiment, the comparator 3 and the PLL 4 are disposed on the downstream pickup 1B side. However, it should be noted that the comparator 3 and the PLL 4 can be disposed on the upstream pickup 1A side.

The output signals of the sample and hold circuits 6A, 6B, and 6C are supplied to the A/D converters 7A, 7B, and 7C, respectively. The A/D converters 7A, 7B, and 7C digitize the respective input signals. The digitized signals are supplied to the band pass filters 8A, 8B, and 8C. The band pass filters 8A, 8B, and 8C extract respective measuring frequencies. The resultant signals are supplied to the DFTs 9A, 9B, and 9C. The DFTs 9A, 9B, and 9C obtain the amplitudes and phases of the measuring frequencies. The DFTs 9A, 9B, and 9C are used to obtain the amplitudes and phases of predetermined frequency components at high speed. Thus, to obtain all frequency components, FFTs (Fast Fourier Transformers) can be used instead of the DFTs. The phase calculating portion 10 calculates the equation (7) for the output signals of the DFTs 9A, 9B, and 9C and thereby obtains α.

The band pass filters 8A, 8B, and 8C work on data that has been sampled at a frequency eight times higher than the measuring frequency. However, even if the measuring frequency varies corresponding to the density of the fluid, the sampling frequency correspondingly varies so as to follow the pass bands of the band pass filters. Thus, it is not necessary to change filter constants and so forth of the program.

Thus, α can be accurately obtained. However, α is adversely affected by the difference in delays of the digitizing circuits for the three signals and the delay of the adding circuit. As an example of this influence, when there is an amplitude difference between the upstream side and the downstream side, α calculated by the equation (7) varies. (When the amplitude difference is constant, since it is treated as a constant offset, it can be simply compensated.) To prevent such an influence, the following two methods can be used in practice.

Figure 12A:
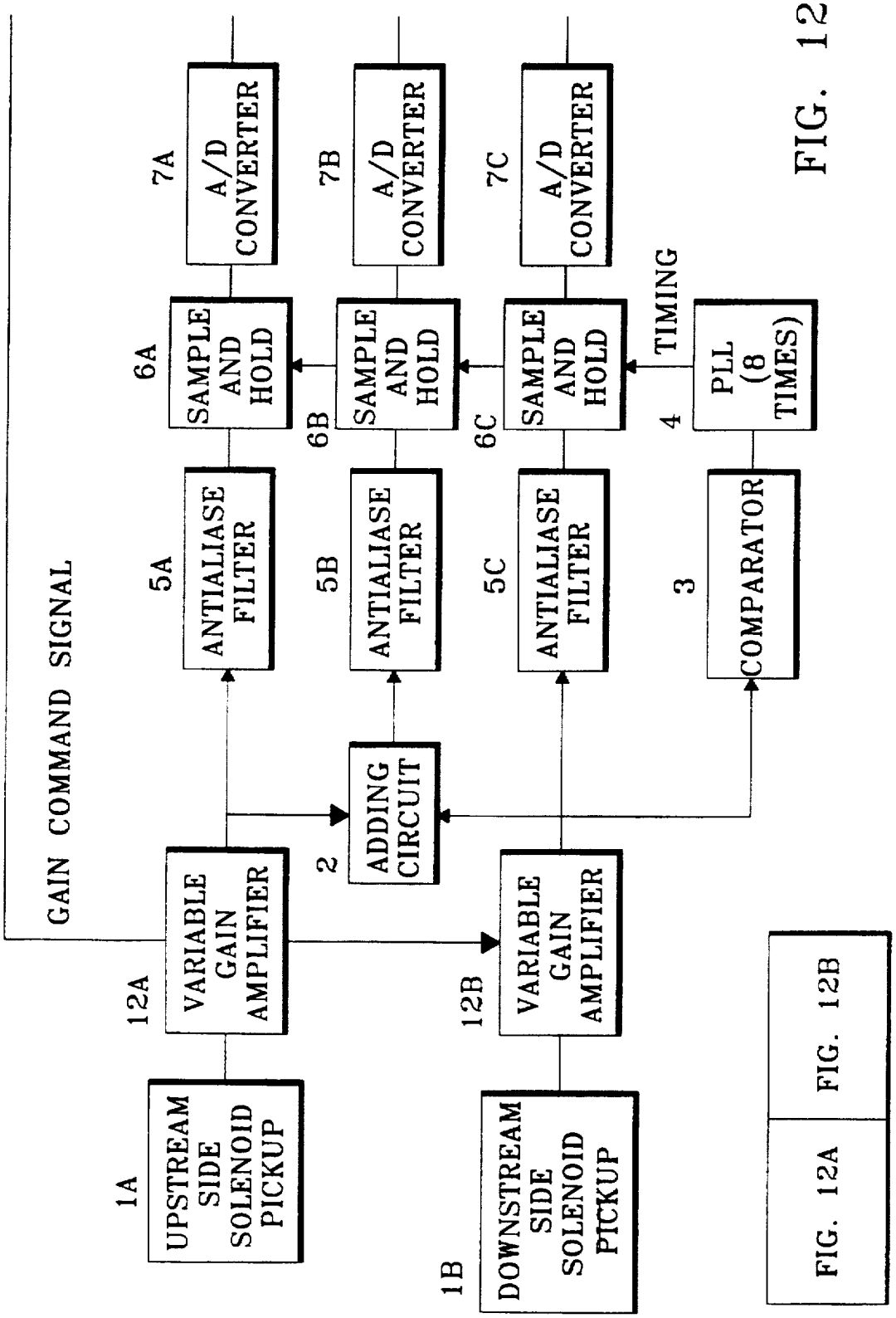
FIG. 12 is a block diagram showing a second embodiment of the present invention.
Figure 12B:
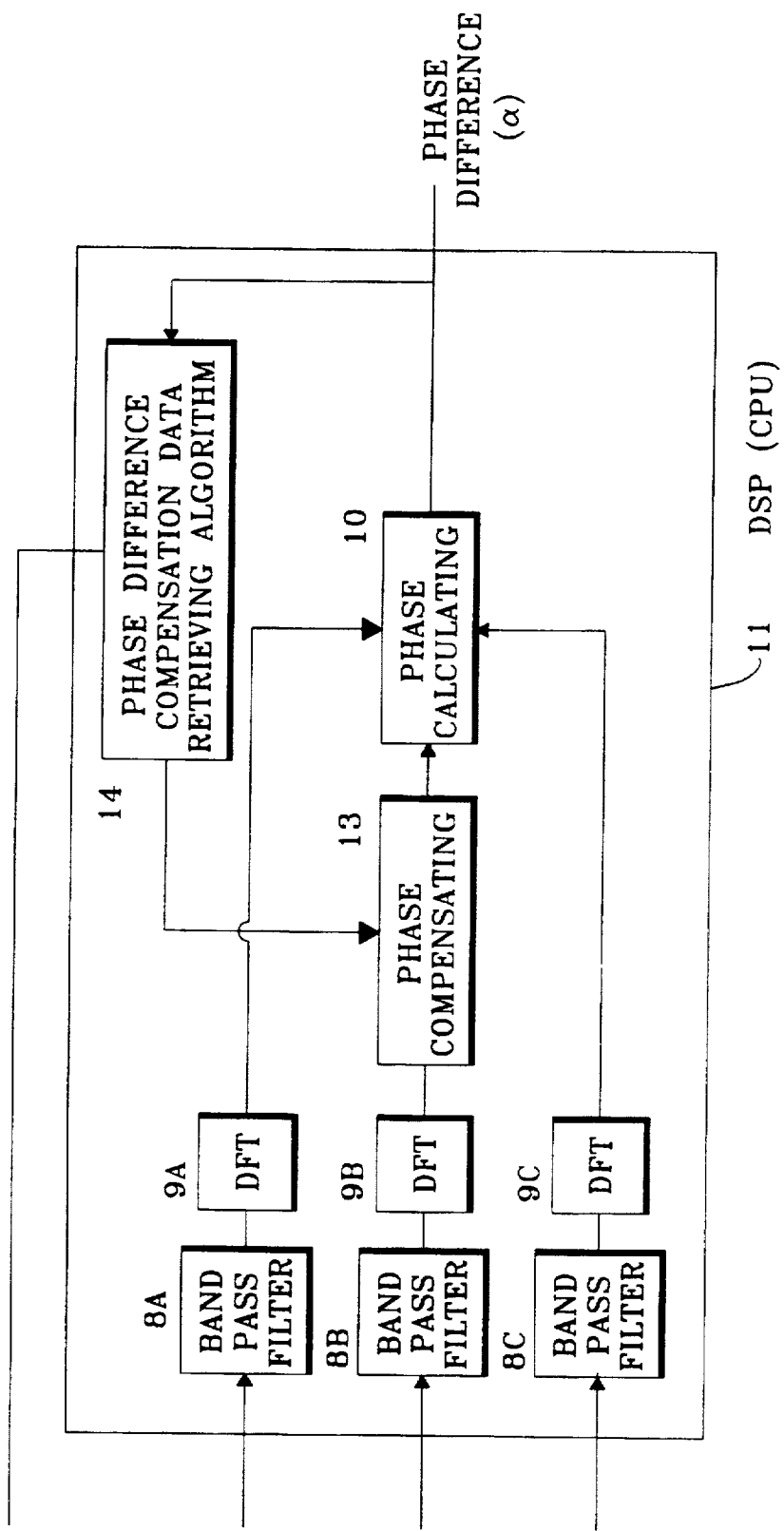

(1) Method for intentionally changing the amplitude difference between the upstream side, and the downstream side and correspondingly obtaining a compensation coefficient (according to a second embodiment of the present invention):

When the amplitude difference between the upstream side and the downstream side varies, E of the equation (7) varies. This is because the "sin" angle of the equation (7) contains a constant error, due mainly to the delay of the adding circuit 2. Thus, as shown in FIG. 12, when variable gain amplifiers (gain control amplifiers) 12A and 12B are adjusted, and thereby there is an amplitude difference between the upstream side and the downstream side, a phase compensating portion 13 compensates the phase difference of an output signal θc of the adding circuit 2 through a DFT 9B (namely, the phase compensating portion 13 advances the phase of the output signal θc) so that the delay of the adding circuit 2 is removed.

To obtain a coefficient to be used for such a compensation (to advance the phase of the program), when the phase difference between the upstream side and the downstream side is constant, a phase compensation data searching algorithm 14 varies the gains of the variable gain amplifiers 12A and 12B. Thus, the amplitude on the upstream side or the downstream side is intentionally varied and thereby causes a phase difference. The variation of α is recorded. The value of the constant for compensating the phase θc is varied so that the variation becomes a minimum. At this point, the variation of amplitudes of the upstream side and the downstream side should be 1% or less. To perform measurement with an accuracy of 0.01% at the maximum flow rate, the compensation constant for the phase θc should have an accuracy in the range of 0.005 deg to 0.008 deg. In addition, even if the phase difference between the variable gain amplifiers is varied, the phase difference error thereof should be 0.

Figure 13A:
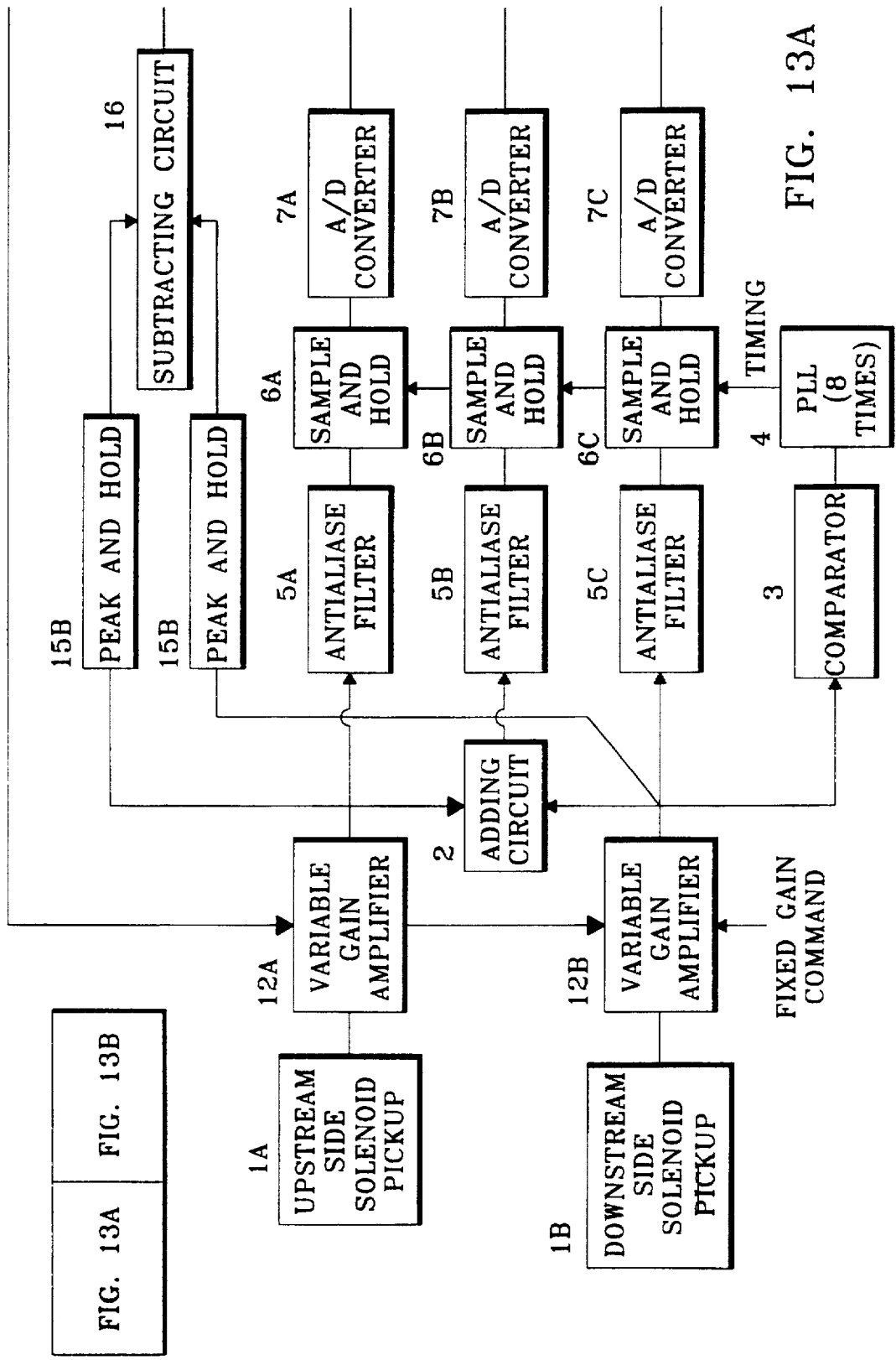
FIG. 13 is a block diagram showing a third embodiment of the present invention.
Figure 13B:
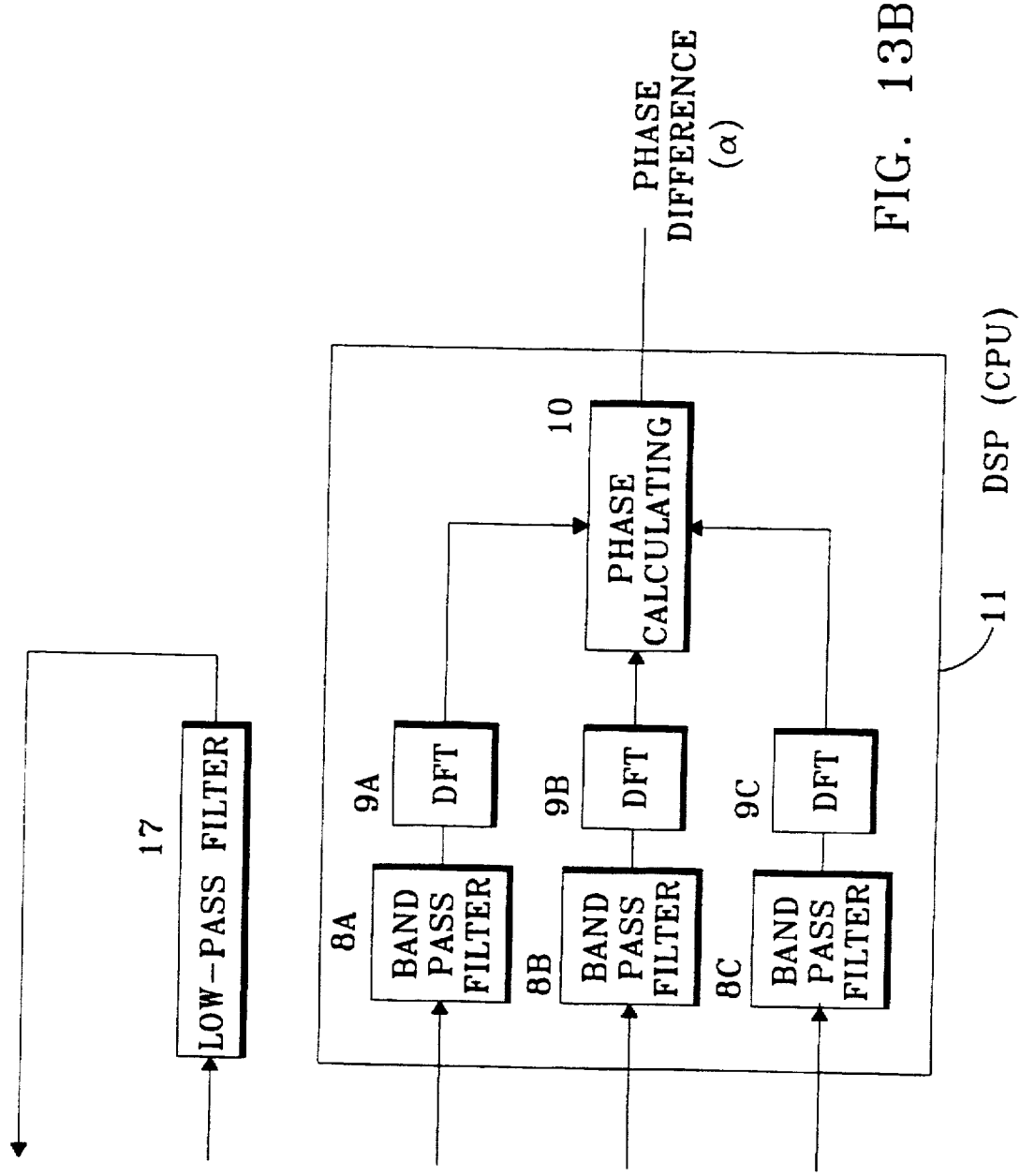

(2) Method for using gain control amplifiers for keeping the amplitude difference between the upstream side and the downstream side constant (according to a third embodiment of the present invention):

As shown in FIG. 13, variable gain amplifiers 12A and 12B, peak hold portions 15A and 15B that hold peak values of the output signals of the solenoid pickups 1A and 1B, a subtracting circuit 16 that calculates the difference between the peak values, and a low pass filter (LPF) 17 that removes noise corresponding to the difference are disposed after solenoid pickups 1A and 1B.

The variable gain amplifiers 12A and 12B are adjusted corresponding to the difference between the peak values on the upstream side and the downstream side (namely the output signal of the subtracting circuit 16) so as to remove the influence of the amplitude difference between the upstream side and the downstream side. When the gains of the variable gain amplifiers 12A and 12B are varied, it is necessary to prevent a phase difference between the input signals and the output signals thereof. In this embodiment, the gain of the variable gain amplifier 12A is variable, whereas the gain of the variable gain amplifier 12B is fixed. However, it should be noted that this relationship can be reversed.

In the above-mentioned embodiments, the Coriolis type mass flowmeter was described. However, it should be appreciated that the present invention is not limited to only this type of apparatus. Instead, the present invention can be applied to any apparatus that measures the phase difference between two signals with the same frequency.

FIG. 14 is a block diagram showing a fourth embodiment of the present invention.

In FIG. 14, reference numeral 21 is a comparator. Reference numeral 22 is a PLL (phase lock loop) that is a frequency multiplying circuit. Reference numerals 23A to 23D are amplitude detecting circuits. Reference numerals 24A and 24B are DC level detecting circuits. Reference numerals 25A and 25B are DC level comparing circuits. Reference numerals 26A and 26B are signal relays that are selectors. Reference numeral 27 is a phase difference measuring portion. Reference numeral 28 is a compensation control unit. Reference numerals 29A and 29B are amplitude comparison circuits. Reference numerals 30A and 30B are DC level control circuits. Reference numeral 31 is an address generating circuit. Reference numeral 32 is an address shifting circuit. Reference numeral 33 is a fetching timing generating circuit. Reference numerals 34A and 34B are ROMs that are sine tables. Reference numerals 35A and 35B are digital/analog (D/A) converters. Reference numerals 36A and 36B are amplitude control circuits.

In this embodiment, measurement signals 1 and 2 that are sine waves with the same frequency are input. The phase difference between the measurement signals 1 and 2 is obtained. The measurement signal 2 is compared with a mean value of the measurement signal 2 by the comparator 21. The resultant signal of the comparator 21 is supplied to the PLL circuit 22. The PLL circuit 22 multiplies the frequency of the output signal of the comparator 21 by, for example, 16,384. Corresponding to the output signal of the PLL circuit 22, the address generating circuit 31 generates 16,384 addresses per one cycle. Corresponding to these addresses, data is read from the ROMs 34A and 34B.

At this point, sine wave amplitude data, of which one cycle is composed of 16,384 addresses, has been stored in the ROMs 34A and 34B. The amplitude data is composed of all bits combined so as to improve the resolution. (In other words, for eight bits, 0 to 255 are used.) The address shifting circuit 32 shifts the address of the ROM 34A corresponding to the phase difference designating signal received from the compensation control unit 28, so as to mutually move the data of the ROMs 34A and 34B. The designated resolution of the phase difference depends on the multiplication factor of the PLL circuit 22. In this embodiment, the resolution of the phase difference is 360 deg/16,384 (=0.021973 deg).

The ROMs 34A and 34B output digital data that has a phase difference corresponding to the phase difference designating signal to the D/A converters 35A and 35B, respectively. The D/A converters 35A and 35B convert the digital data into analog compensation signals. The output signals of the D/A converters 35A and 35B are synchronized using a fetching timing signal generated by the timing generating circuit 33 corresponding to the output signal of the PLL circuit 22.

Although the output signals of the D/A converters 35A and 35B have a phase difference corresponding to the phase difference designating signal, the amplitudes of the output signals should accord with those of the measurement signal. In this embodiment, the amplitude reference signals of the D/A converters are varied so as to vary the magnitude (for example voltage) per bit. In other words, although the amplitudes are varied, the phase difference of the signals (delay) is not varied.

The amplitude detecting circuits 23A and 23B detect the amplitudes of the measurement signals 1 and 2, respectively. The amplitudes of the output signals of the D/A converters 35A and 35B are detected by the amplitude detecting circuits 23C and 23D, respectively. The output signals of the amplitude detecting circuits 23A and 23C are compared by the amplitude comparison circuit 29A. The output signals of the amplitude detecting circuits 23B and 23D are compared by the amplitude comparison circuit 29B. Thus, amplitude errors between the measurement signals and the output signals of the D/A converters (compensation signals) are obtained. The amplitude control circuits 36A and 36B control the amplitude reference signals (maximum value) of the D/A converters 35A and 35B so as to decrease the errors.

In the above-described method, the amplitudes of the signals (AC components) are matched. Likewise, the centers (or DC levels) of the measurement signals and the output signals (compensation signals) of the D/A converters are matched by the DC level detecting circuits 24A to 24D, the DC level comparing circuits 25A and 25B, the DC level control circuits 30A and 30B, and so forth. The DC levels of the signals are horizontally shifted while the difference between the maximum and the minimum values of the amplitude reference signal for each D/A converter is kept constant.

The output signals of the D/A converters (compensation signals) have the same frequency, the same amplitude, and the same DC level as those of the measurement signals 1 and 2. The phase difference of the output signals of the D/A converters is a known value corresponding to the phase difference designating signal. Thus, with these signals, the phase difference measuring portion 27 is compensated.

Figure 15:
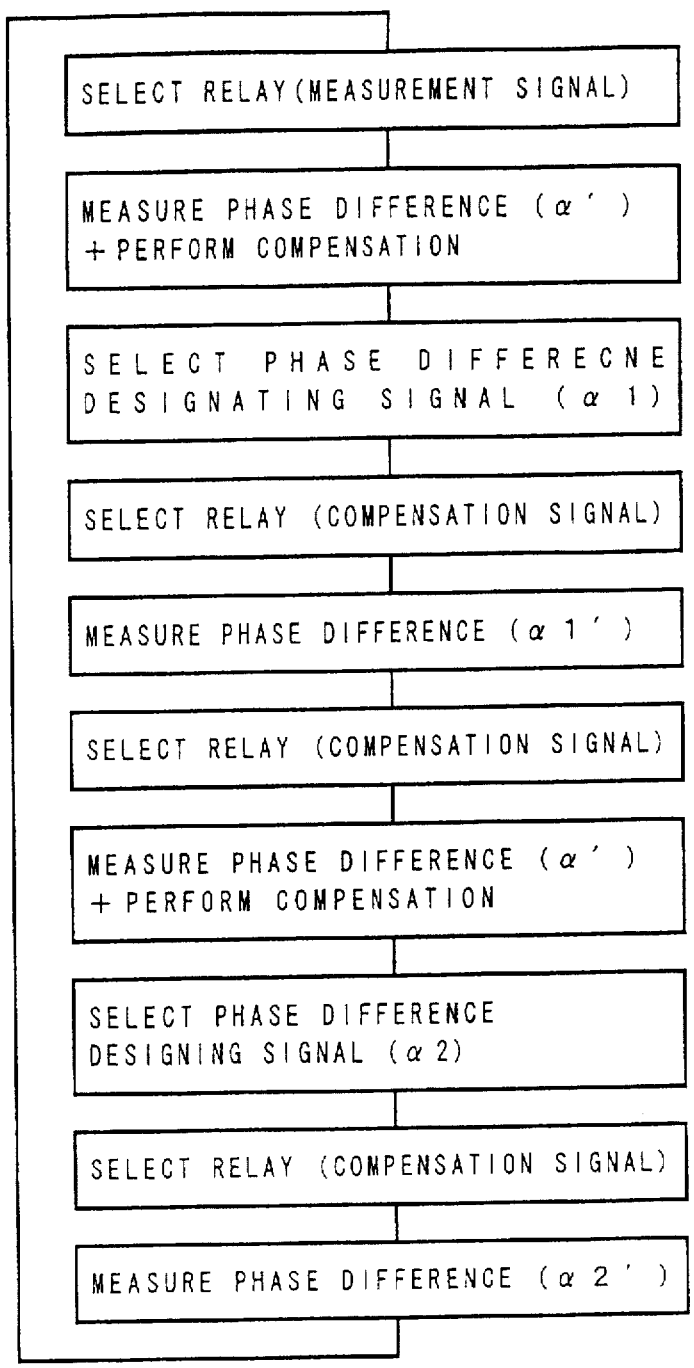
FIG. 15 is a flow chart showing a process of a compensation control apparatus of FIG. 14.

FIG. 15 is a flow chart showing the compensation process.

In this compensation process, compensation signals $\alpha 1'$ and $\alpha 2'$ corresponding to phase difference designating signals $\alpha 1$ and $\alpha 2$, and a measurement signal (with a phase difference $\alpha'$), are alternately measured on a time sharing basis. The selection of these signals is performed by the compensation control unit 28 corresponding to the phase difference designating signal and the relay selecting signal. In this case, the measurement time of the compensation signals (with phase differences of $\alpha 1'$ and $\alpha 2'$) should be sufficiently smaller than the measurement time of the measurement signal ($\alpha'$) within the range that the predetermined compensation accuracy is satisfied, so as to prevent the response to the variation of the phase difference of the measurement signals.

Figure 16:
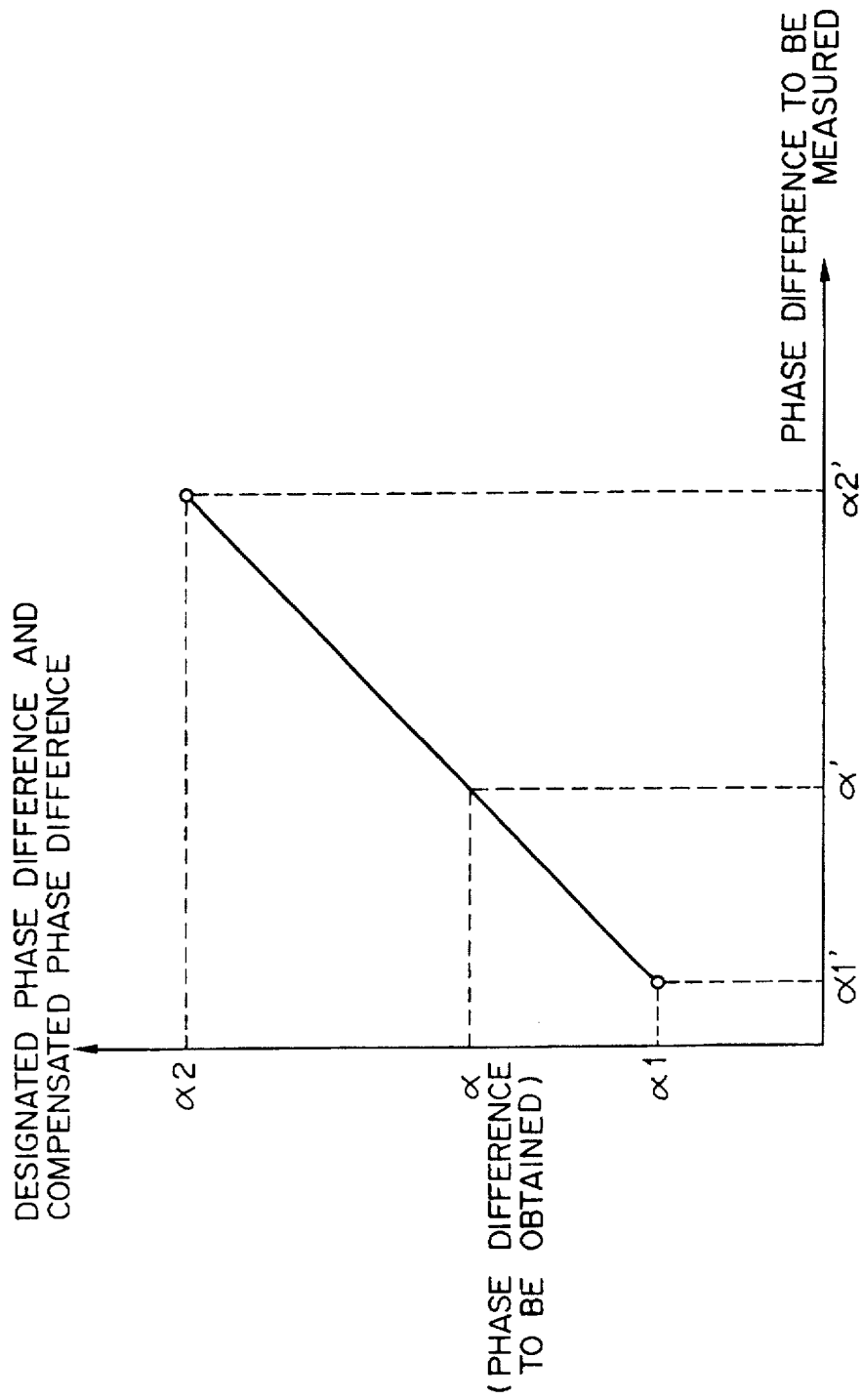
FIG. 16 is a graph showing an operation of the compensation control apparatus of FIG. 14.

In such a method, the phase differences $\alpha 1'$, $\alpha 2'$, and $\alpha'$ are measured. Corresponding to the results, a compensation as shown in FIG. 16 is performed. The phase differences $\alpha 1'$ and $\alpha 2'$ preferably accord with the upper limit and the lower limit of the phase differences, from the point of view of accuracy.

In FIG. 16, the horizontal axis represents measured results $\alpha 1'$, $\alpha 2'$, and $\alpha'$ obtained by the phase difference measuring portion 27. The vertical axis represents the designated phase differences α1 and α2 and the measured result α that has been compensated. In FIG. 16, with values for α1', α2', α', α1, and α2 known, α is obtained. In practice, a straight line that passes through two points (α1', α1) and (α2', α2) is obtained. From the straight line, the value α on the vertical axis corresponding to the value α' on the horizontal axis is obtained. Thus, α is the accurate phase difference between the measurement signals of which a phase difference measurement error due to variations in frequency, amplitude, and DC level, has been compensated for.

In the above-described compensation, although the influence due to errors in the frequency, amplitude, and DC level can be removed, there may still be an offset-type phase difference between the measurement signals 1 and 2. Depending on the application for measuring a phase difference, as the measured results of the measurement signals 1 and 2 that have a phase difference, the phase difference should be 0. In this case, phase difference signals that are input as the measurement signals 1 and 2 are treated as reference 0 signals. The reference 0 signal (zero adjust signal) are input from an input unit to a compensation control unit 28. The compensated data is stored in a non-volatile memory 28A or the like in the compensation control unit 28. The value is subtracted from the compensated data. In this method, offset of phase difference are adjusted (zero adjustment).

In the fourth embodiment, the measurement signals and the compensation signals are alternately selected on a time sharing basis so as to remove error components due to variations in frequency, amplitude, and DC level. However, in an application in which the phase difference of measurement signals sharply varies, the decrease of the response of the time sharing process may adversely affect the measurement result. To solve such a problem, as a fifth embodiment, a set of data used for the compensation has been prepared. Corresponding to the prepared data, the measurement result of the phase difference is compensated. This method is referred to as an offline method. In this method, it takes a long time to obtain the compensation data. In addition, any changes in tolerances with age cannot be compensated for. However, the response of the measurement result virtually does not degrade.

Figure 17A:
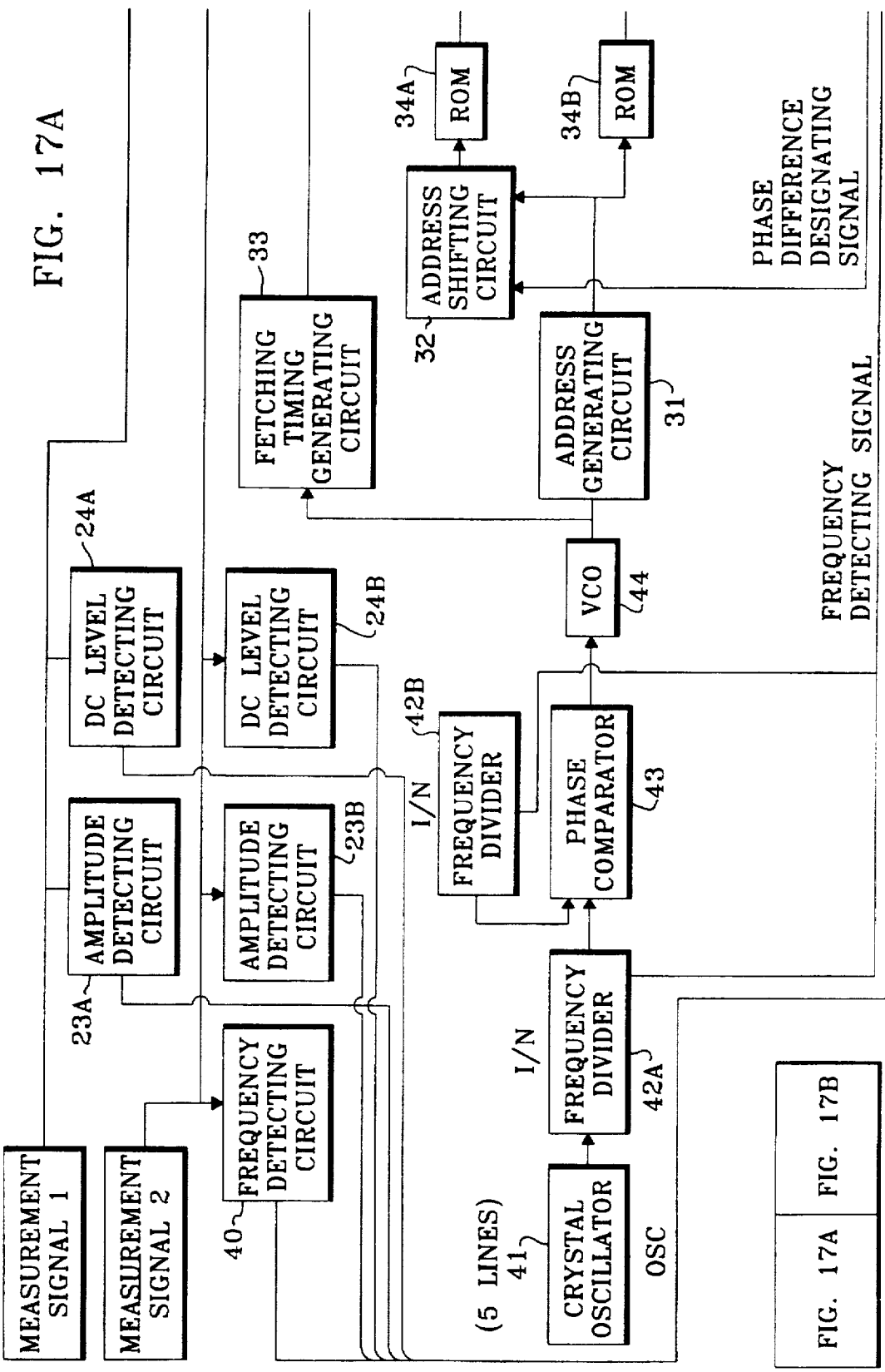
FIG. 17 is a block diagram showing a fifth embodiment of the present invention.
Figure 17B:
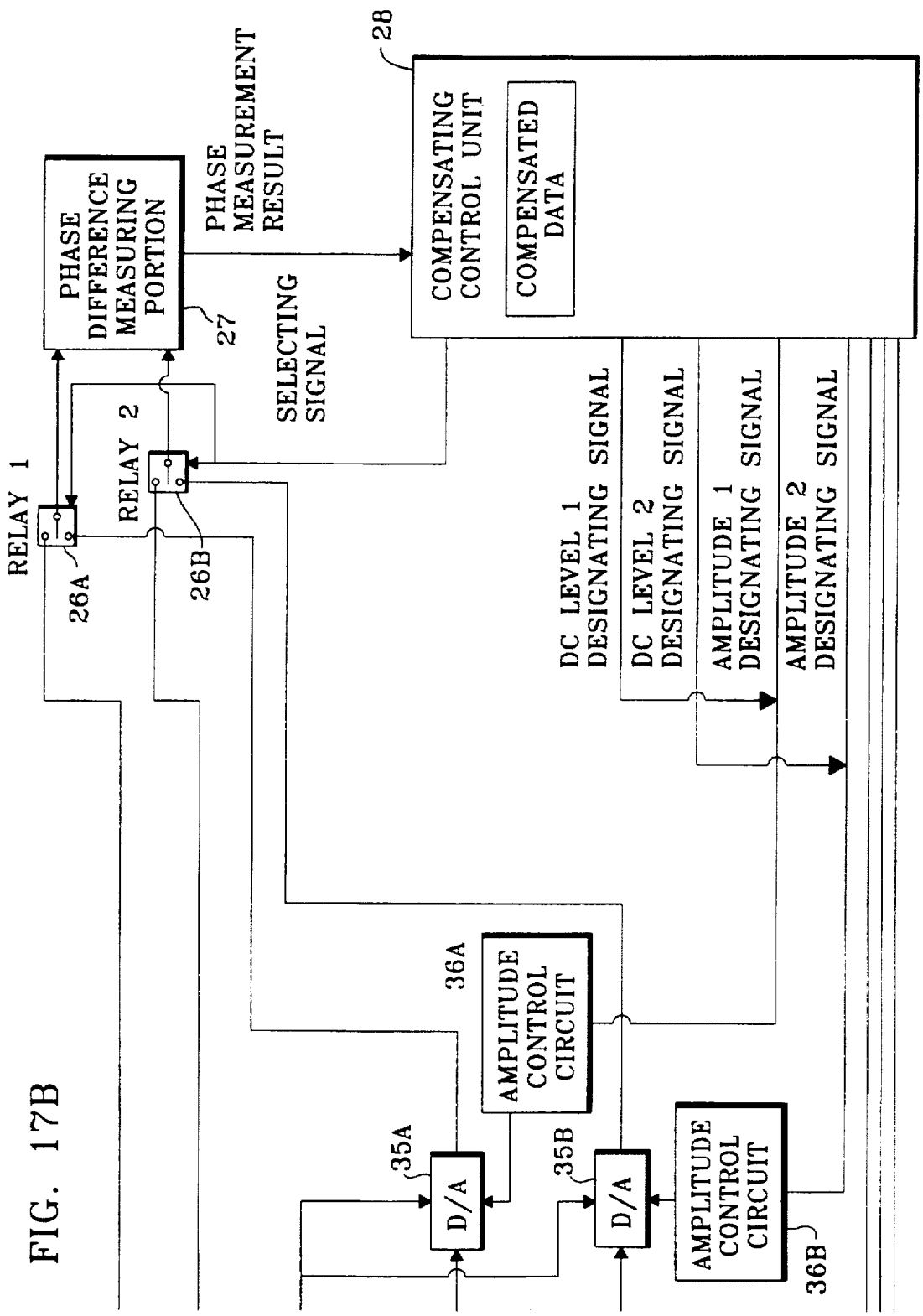

FIG. 17 is a block diagram showing a fifth embodiment of the present invention.

In this embodiment, the frequency of a compensation signal is designated by the oscillation frequency (OSC) of a crystal oscillator 41, the ratio (N/M) of frequency dividers 42A and 42B, and the number of clock pulses (CYC) which is necessary for one cycle of a sine wave that is output from each D/A converter. Thus, the frequency of the compensation signal is expressed by the following equation.

$$f=OSC \times (N/M)/(CYC)$$

The control method of the amplitudes, DC levels, and phase differences of the compensation signals of this embodiment is the same as those of the fourth embodiment. However, in the fifth embodiment, the amplitudes and DC levels are controlled by a compensation control unit 28, unlike for those of the fourth embodiment.

The compensation control unit 28 has obtained compensation data used for measurement. The compensation data is a four-dimensional table composed of frequencies, amplitudes, DC levels, and phase differences of compensation signals. Thus, as the number of samples of each dimension increases, the data amount of the compensation data remarkably increases. Consequently, the number of samples of each dimension should be reduced. Since the compensation data does not fully accord with the conditions of all measurements, linear interpolation between two adjacent data in each dimension of the compensation data needs to be used so as to improve the compensation accuracy without the need to increase the data amount of the compensation data.

Thus, by subtracting compensation data that is searched (look up) or interpolated from a phase difference measurement value of a phase difference measuring portion 27, errors in frequencies, amplitudes, and DC levels can be compensated for.

Figure 18:
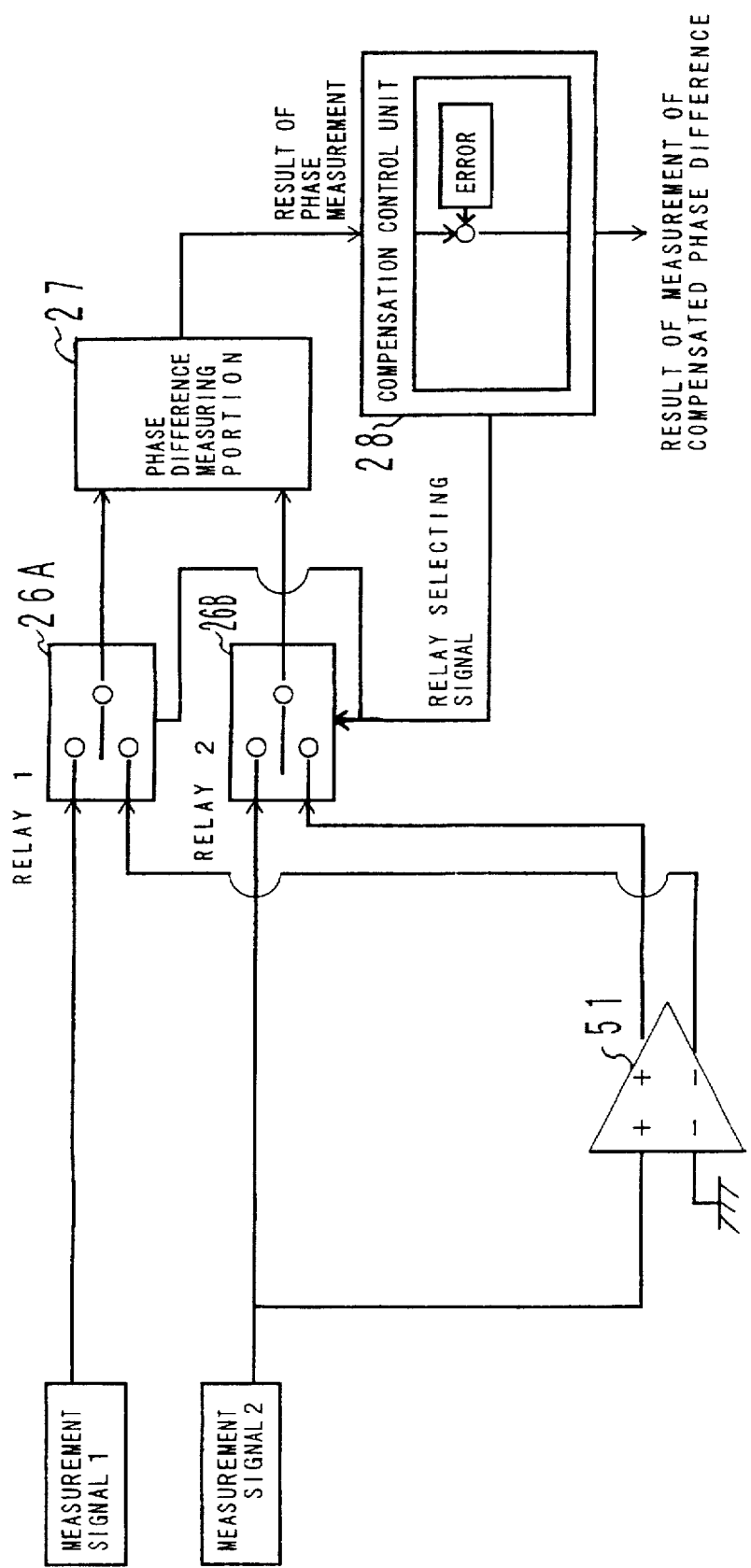
FIG. 18 is a block diagram showing a sixth embodiment of the present invention.
Figure 14B:
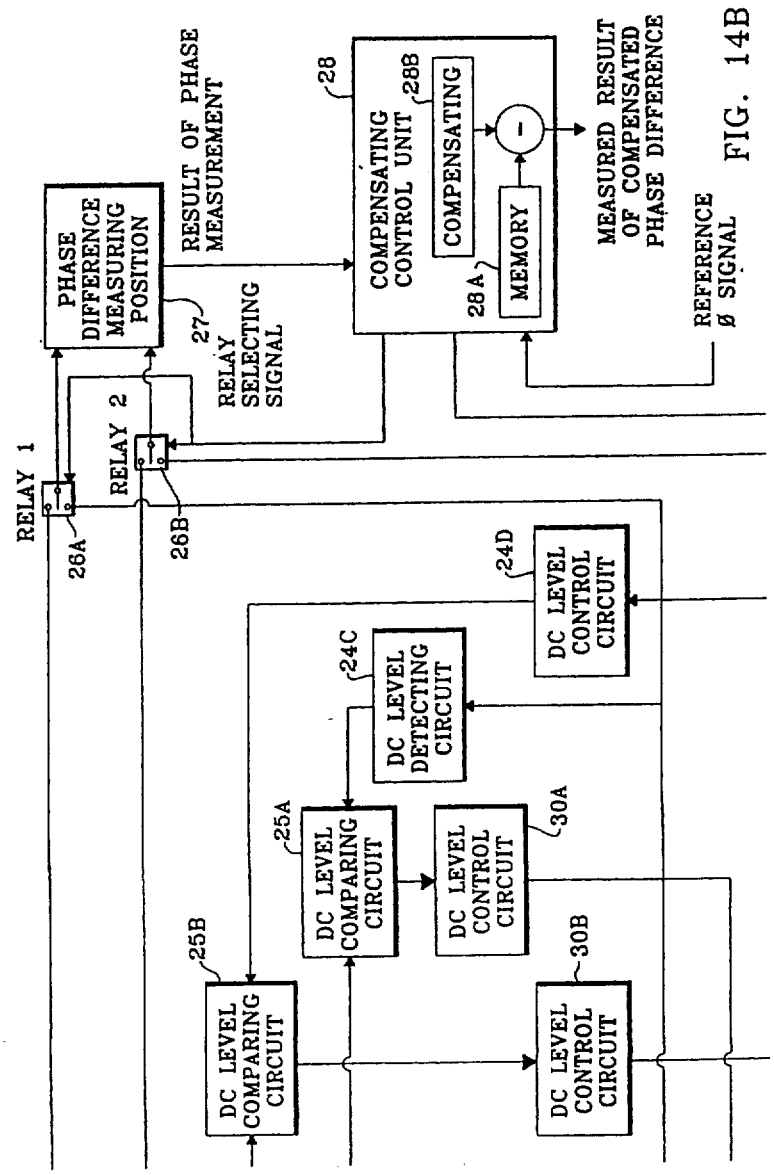

The difference between the fourth embodiment and the fifth embodiment is whether or not compensation is performed on a real time basis. In these embodiments, errors due to variations of frequencies, amplitudes, and DC levels are compensated. In a sixth embodiment, only an error due to a variation in frequencies is compensated for. However, the circuit construction can be simplified. This embodiment can be applied for an application in which an error due to a variation in frequencies is dominant, and errors due to variations in amplitudes and DC levels are rare. FIG. 18 is a block diagram showing a construction of the fifth embodiment of the present invention.

One of the measurement signals is connected to the +side input terminal of a differential amplifier 51 with an amplification factor of 1. The −side input terminal of the differential amplifier 51 is grounded. A compensation control unit 28 controls relays 26A and 26B so as to alternately select the measurement signals, and a compensation signal that is output from the differential amplifier 51 on time sharing basis. With reference to a phase difference of 0 deg or 180 deg of the measured result of the compensation signal, the phase difference of the measurement signals is compensated for.

In this embodiment, a differential amplifier 51 is used as a reference signal generator with a phase difference of 180 deg. In addition, a transformer can be used as a reference signal generator with a phase difference of 180 deg. As a reference signal that can be easily generated, one measurement signal is connected to both input terminals of the phase difference measuring portion so as to generate a reference signal with a phase difference of 0 deg. The phase difference of the reference signal can be selected from 0 deg and 180 deg in consideration of a phase difference to be measured, accuracy of the compensation, circuit scale to be added, and so forth. In any case, the magnitude of the variation of the phase difference of reference signals corresponding to the variations of frequencies, amplitudes, and DC levels of the measurement signals, should be sufficiently smaller than the error of the phase difference measuring portion to be compensated.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A phase difference measuring apparatus for measuring the phase difference between two signals with the same frequency, comprising:

first calculating means for calculating the sum or the difference of the two signals;

quantizing means for quantizing the output signal of said first calculating means and the two signals;

band pass filter means for extracting only a predetermined frequency component from each quantized signal; and second calculating means for performing a Fourier transformation and a predetermined operation on the output signals of said band pass filter means, so as to calculate the phase difference of the two signals at a measuring frequency.

2. The phase difference measuring apparatus as set forth in claim 1, wherein said quantizing means include:

a comparator for digitizing the amplitude of one of the two signals and for providing a PLL circuit with a digitized output signal;

said PLL circuit generating a signal with a frequency n times (where $n \geq 2$) higher than the frequency of said digitized output signal of the comparator; and sample and hold means for sampling and holding the output signal of said first calculating means and the two signals at a timing of the output signal of the PLL circuit.

3. The phase difference measuring apparatus as set forth in claim 1, wherein said first calculating means has a gain selecting function for selecting a detection range and a resolution corresponding the phase difference to be detected.

4. The phase difference measuring apparatus as set forth in claim 1, wherein said quantizing means includes sample and hold means for sampling and holding the two signals and the output signal of said first calculating means.

5. The phase difference measuring apparatus as set forth in claim 1, further comprising:

amplitude varying means for varying the amplitude of at least one of the two signals; and compensating means for obtaining compensation data corresponding to the variation in the amplitudes of the two signals and for compensating the phase difference corresponding to the compensation data.

6. The phase difference measuring apparatus as set forth in claim 1, further comprising:

signal amplitude difference detecting means for detecting the amplitude difference of the two signals; and a gain control amplifier for matching the amplitude of one of the two signals with the amplitude of the other signal corresponding to the amplitude difference.

7. A mass flowmeter for causing a fluid to flow in a vibrating pipe and Coriolis force of the flow and angular vibration of the pipe to twist-vibrate the pipe, and for obtaining the mass and flow rate of the fluid corresponding to the time difference between twisted asymmetrical vibrations of the pipe, comprising;

a pair of detectors for detecting the asynchronous twisting vibrations of the pipe;

first calculating means for calculating the sum or the difference of the output signals of said detectors;

quantizing means for quantizing the output signals of said first calculating means and said detectors;

band pass filter means for extracting only a predetermined frequency component from each quantized signal; and second calculating means for performing a Fourier transformation and a predetermined operation for the output signals of said band filter means so as to calculate the phase difference of the output signals of said detectors at a measuring frequency.

8. The mass flowmeter as set forth in claim 7, wherein said quantizing means includes:

a comparator for digitizing the amplitudes of the output signals of the detectors and for providing a PLL circuit with a digitized output signal;

said PLL circuit for generating a signal with a frequency n times ($n \geq 2$) higher than the frequency of said digitized output signal of the comparator;

sample and hold means for sampling and holding the output signals of said first calculating means and said detectors at a timing of the output signal of the PLL circuit; and A/D converting means for converting the output signal of said sample and hold means.

9. The mass flowmeter as set forth in claim 7, further comprising:

amplitude varying means for varying the amplitude of at least one of the output signals of said detectors; and compensating means for obtaining compensation data corresponding to the variation in the amplitudes of the output signals of said detectors and for compensating the phase difference corresponding to the compensation data.

10. The mass flowmeter as set forth in claim 7, further comprising:

signal amplitude difference detecting means for detecting the amplitude difference between the output signals of said detectors; and a gain control amplifier for matching the amplitude of one of the output signals of said detectors with the amplitude of the other signal corresponding to the amplitude difference.

11. A phase difference measuring method for measuring the phase difference between two signals with the same frequency, comprising the steps of:

providing an output signal by calculating a sum or a difference of the two signals;

quantizing said output signal and the two signals;

providing an extracted signal by extracting only a predetermined frequency component from each quantized signal; and performing a Fourier transformation and a predetermined operation on the extracted signals, so as to calculate the phase difference of said extracted signals at a measuring frequency.

* * * * *

UNITED STATES PATENT AND TRADEMARK OFFICE
CERTIFICATE OF CORRECTION

PATENT NO. : 5,767,665
DATED : June 16, 1998
INVENTOR(S) : Akira Morita, et al.

Figure 14A:
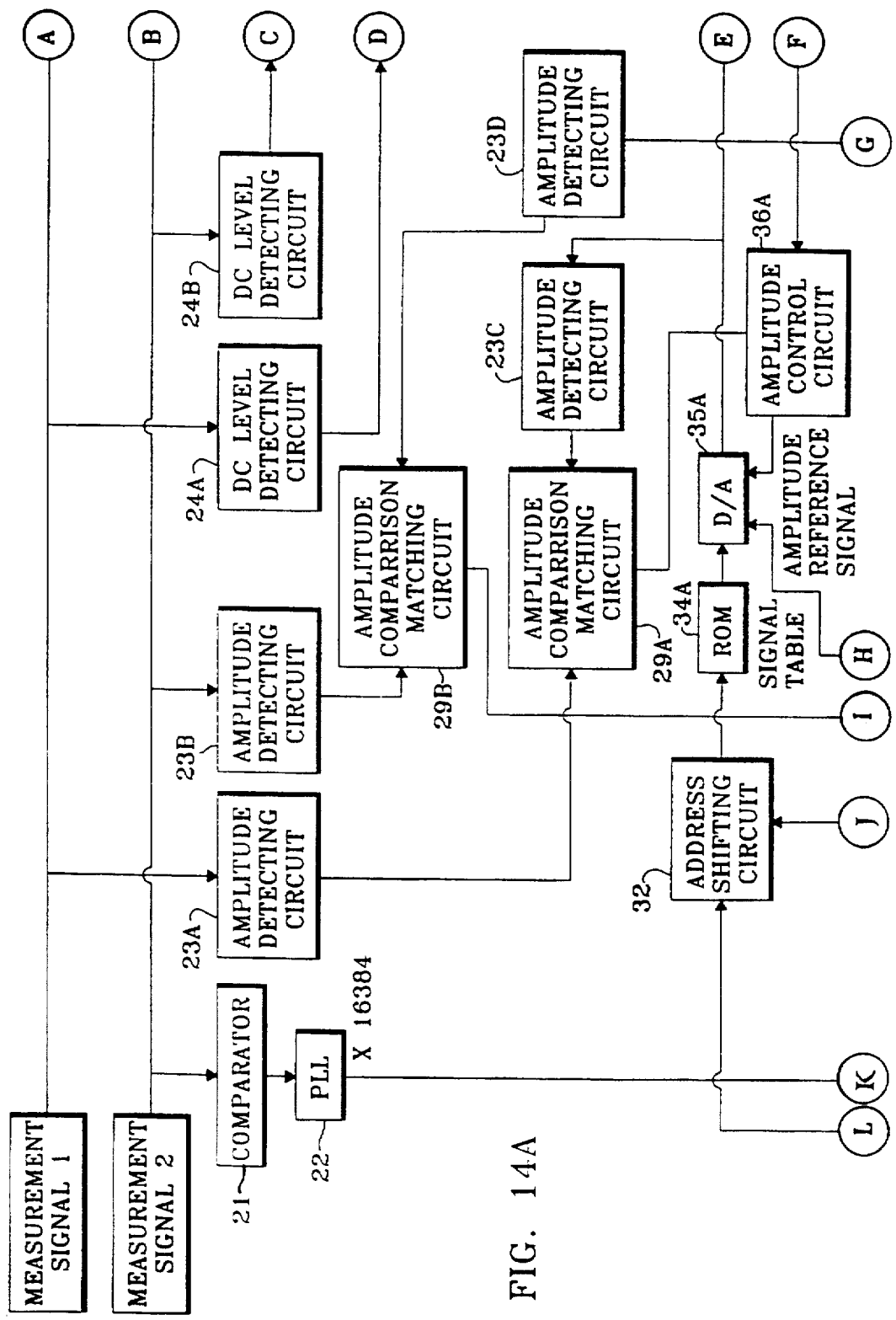
FIG. 14 is a block diagram showing a fourth embodiment of the present invention.
Figure 14B:
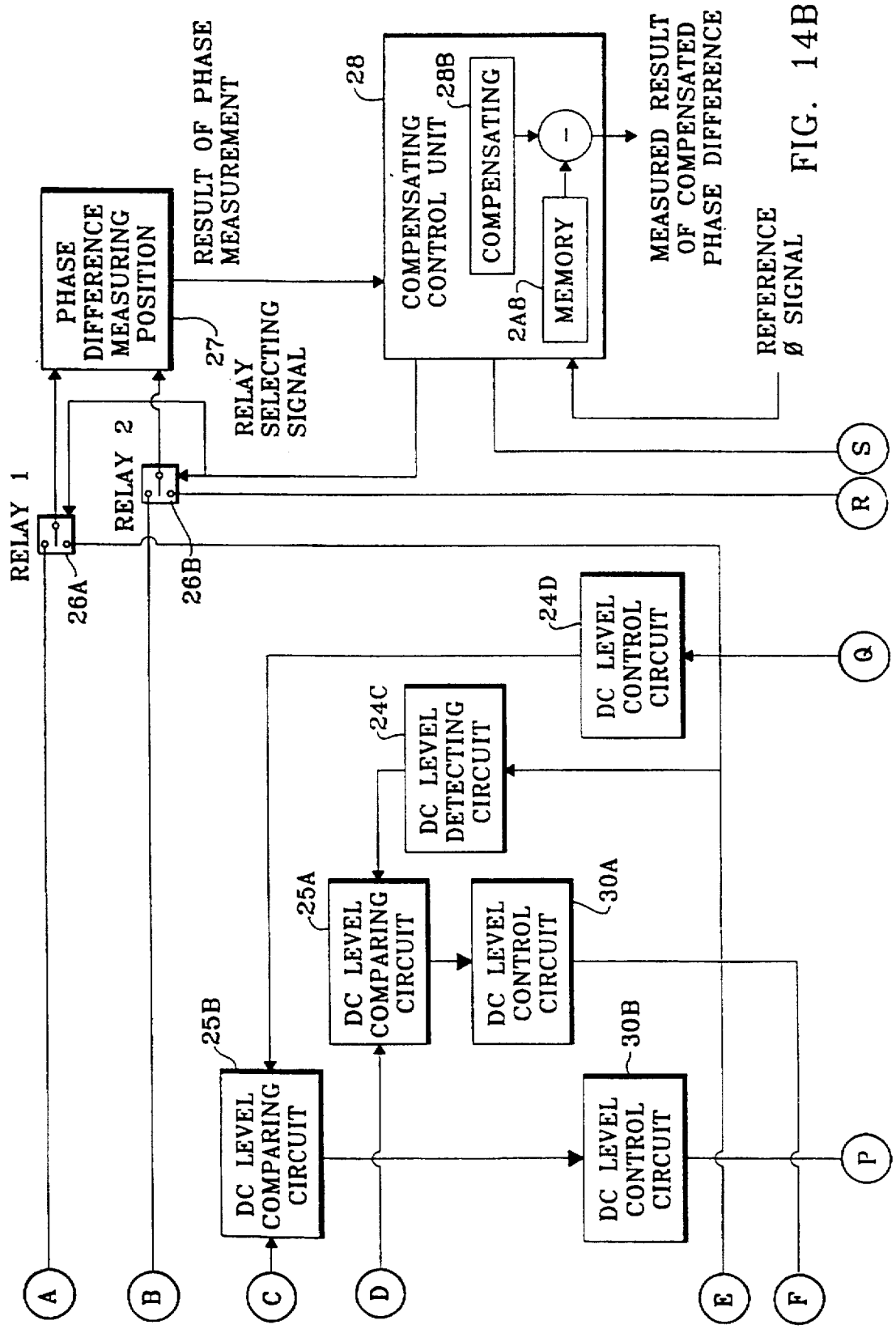
Figure 14C:
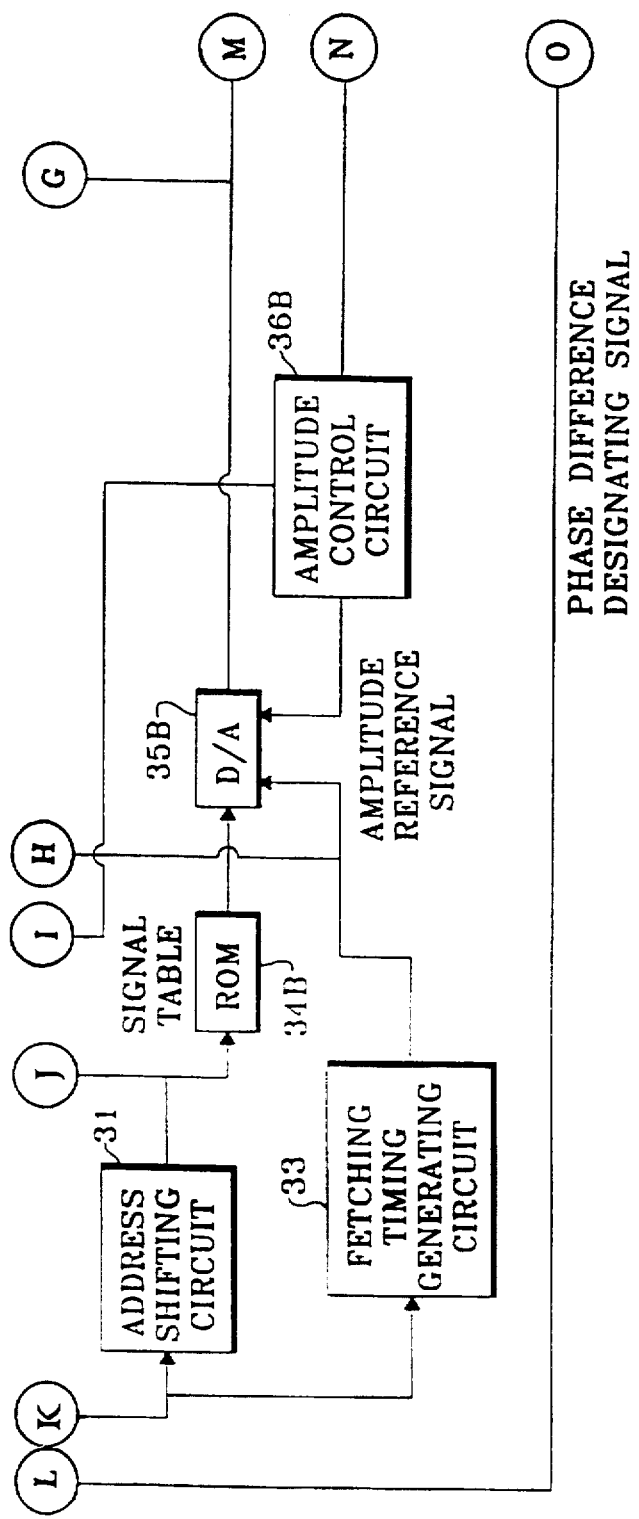
Figure 14D:
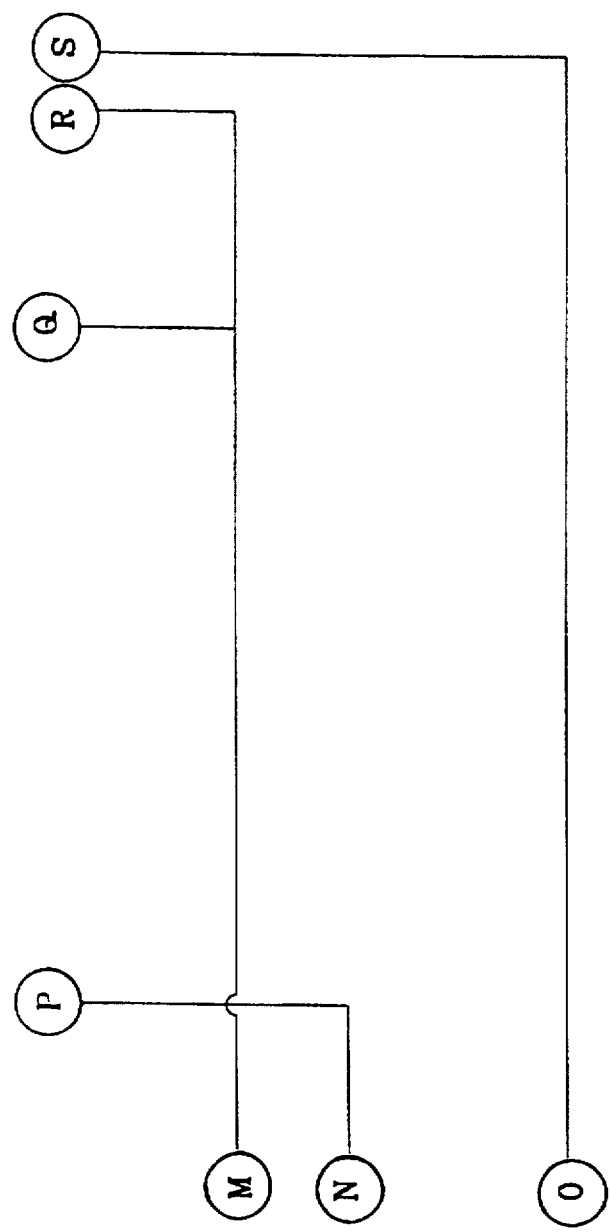

It is certified that error appears in the above-identified patent and that said Letters Patent is hereby corrected as shown below:

The sheets of drawings consisting of Fig. 14B, Fig. 17A, should be deleted to appear as per attached sheets.

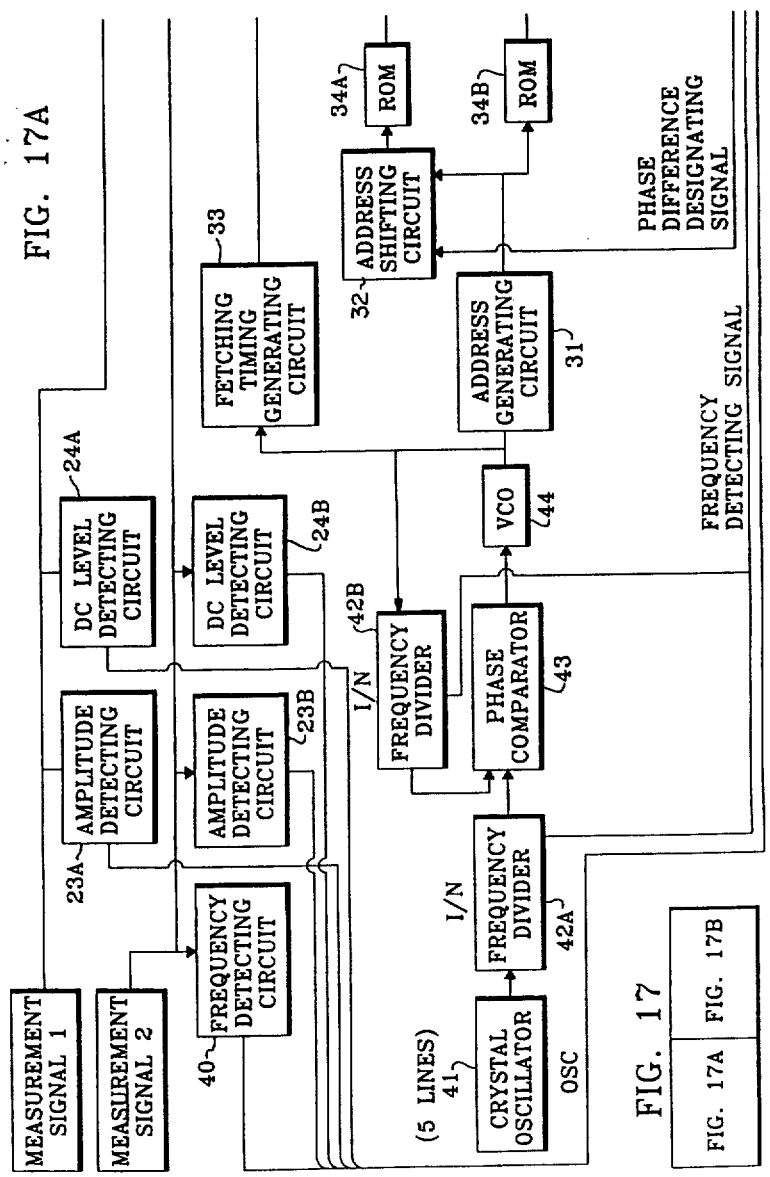

UNITED STATES PATENT AND TRADEMARK OFFICE
CERTIFICATE OF CORRECTION

Page 4 of 6

PATENT NO. : 5,767,665
DATED : June 16, 1998
INVENTOR(S) : Morita et al.

It is certified that error appears in the above-identified patent and that said Letters Patent is hereby corrected as shown below:

On the title page:

Under "[56] References Cited" and "U.S. Patent Documents" insert --5,009,109 4/1991 Kalotay et al.--

Under "[56] References Cited" and "Foreign Patent Documents" insert --0212782 A1, 3/1981 EPO--

Column 2, line 64, delete "2 cos $\Omega t$" and insert --2 cos $\omega t$-- therefor Column 10, line 3, after "Fig. 12" insert --, which is divided into two sections 12A and 12B,--

UNITED STATES PATENT AND TRADEMARK OFFICE
CERTIFICATE OF CORRECTION

PATENT NO. : 5,767,665
DATED : June 16, 1998
INVENTOR(S) : Morita et al.

It is certified that error appears in the above-identified patent and that said Letters Patent is hereby corrected as shown below:

Column 10, line 5, after "Fig. 13" insert --, which is divided into two sections 13A and 13B,--

Column 10, line 7, after "Fig. 14" insert --, which is divided into four sections 14A, 14B, 14C, and 14D,--

Column 10, line 13, after "Fig. 17" insert --, which is divided into two sections 17A and 17B,--

Column 11, line 2, delete "discreate" and insert --discrete-- therefor

Column 11, line 8, delete "$=\pi\theta d=(\theta a+\theta b-\pi)/2$" and insert -- $=\pi$ -- therefor

UNITED STATES PATENT AND TRADEMARK OFFICE
CERTIFICATE OF CORRECTION

PATENT NO. : 5,767,665
DATED : June 16, 1998
INVENTOR(S) : Morita et al.

It is certified that error appears in the above-identified patent and that said Letters Patent is hereby corrected as shown below:

Column 11, line 10, before "Thus, the"

insert on a new line, $--\theta d = (\theta a + \theta b - \pi)/2--$

Column 12, line 25, delete "E" and insert $--\propto--$ therefor

Signed and Sealed this

Third Day of November, 1998

BRUCE LEHMAN

*Attest:*

*Attesting Officer*           Commissioner of Patents and Trademarks